United States Patent
Kumazaki et al.

(10) Patent No.: US 12,111,577 B2
(45) Date of Patent: Oct. 8, 2024

(54) LINE NARROWING DEVICE, ELECTRONIC DEVICE MANUFACTURING METHOD

(71) Applicant: Gigaphoton Inc., Tochigi (JP)

(72) Inventors: Takahito Kumazaki, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 261 days.

(21) Appl. No.: 17/818,916

(22) Filed: Aug. 10, 2022

(65) Prior Publication Data

US 2022/0385027 A1    Dec. 1, 2022

Related U.S. Application Data

(63) Continuation of application No. PCT/JP2020/012546, filed on Mar. 19, 2020.

(51) Int. Cl.
*G03F 7/00* (2006.01)
*H01S 3/08* (2023.01)
*H01S 3/106* (2006.01)

(52) U.S. Cl.
CPC ...... *G03F 7/70025* (2013.01); *H01S 3/08009* (2013.01); *H01S 3/106* (2013.01)

(58) Field of Classification Search
CPC .... G03F 7/70025; G03F 7/20; G03F 7/70041; G03F 7/70575; H01S 3/08009; H01S 3/106; H01S 3/036; H01S 3/08; H01S 3/08004; H01S 3/0805; H01S 3/0809; H01S 3/0826; H01S 3/10069; H01S 3/104; H01S 3/11; H01S 3/137; H01S 3/225

See application file for complete search history.

(56) References Cited

U.S. PATENT DOCUMENTS

2002/0154661 A1    10/2002   Hoose et al.
2009/0135857 A1    5/2009    Oh et al.
(Continued)

FOREIGN PATENT DOCUMENTS

JP    102-276283 A    11/1990
JP    2006-269628 A   10/2006
(Continued)

OTHER PUBLICATIONS

International Search Report issued in PCT/JP2020/012546; mailed Jun. 23, 2020.

(Continued)

*Primary Examiner* — Deoram Persaud
(74) *Attorney, Agent, or Firm* — Studebaker & Brackett PC

(57) ABSTRACT

A line narrowing device includes first and second prisms disposed at positions different in a wavelength dispersion direction of any of the first and second prisms, a third prism disposed on the optical path of an optical beam and through which the beam width of the optical beam is enlarged and first and second parts of the optical beam are incident on the first and second prisms, respectively, a grating disposed across the optical path of the first part having passed through the first prism and the optical path of the second part having passed through the second prism, a first actuator configured to adjust the incident angle of the first part on the grating, a second actuator configured to adjust the incident angle of the second part on the grating, and a third actuator configured to adjust an energy ratio of the first and second parts.

20 Claims, 12 Drawing Sheets

(56) References Cited

U.S. PATENT DOCUMENTS

| | | | |
|---|---|---|---|
| 2010/0097704 A1* | 4/2010 | Algots | H01S 3/1055 |
| | | | 359/566 |
| 2013/0215916 A1 | 8/2013 | Kakizaki et al. | |
| 2014/0092932 A1 | 4/2014 | Ichihara | |
| 2014/0185634 A1 | 7/2014 | Ichihara et al. | |
| 2018/0041000 A1* | 2/2018 | Miyamoto | G02B 17/004 |
| 2019/0181607 A1* | 6/2019 | Miyamoto | H01S 3/0812 |
| 2021/0294223 A1* | 9/2021 | Yamanaka | G03F 7/2041 |
| 2022/0385022 A1* | 12/2022 | Kumazaki | H01S 3/137 |
| 2022/0385028 A1* | 12/2022 | Fujii | H01S 3/104 |
| 2022/0385030 A1* | 12/2022 | Fujimaki | H01S 3/0826 |
| 2023/0064314 A1* | 3/2023 | Kumazaki | H01S 3/10069 |
| 2023/0155343 A1* | 5/2023 | Fujimoto | G03F 7/70041 |
| | | | 430/30 |
| 2023/0187896 A1* | 6/2023 | Maekawa | H01S 3/137 |
| | | | 355/67 |
| 2023/0208094 A1* | 6/2023 | Kumazaki | G03F 7/70575 |
| | | | 355/67 |
| 2023/0352900 A1* | 11/2023 | Fujii | H01L 21/027 |
| 2024/0111219 A1* | 4/2024 | Kishimoto | H01S 5/06216 |
| 2024/0136787 A1* | 4/2024 | Fujimaki | G03F 7/7015 |

FOREIGN PATENT DOCUMENTS

| | | |
|---|---|---|
| JP | 2007-005538 A | 1/2007 |
| JP | 2009-130351 A | 6/2009 |
| JP | 2013-062484 A | 4/2013 |
| JP | 2013-089680 A | 5/2013 |
| JP | 2014-072506 A | 4/2014 |
| WO | 2016/189722 A1 | 12/2016 |
| WO | 2016/189968 A1 | 12/2016 |

OTHER PUBLICATIONS

International Preliminary Report On Patentability and Written Opinion issued in PCT/JP2020/012546; issued Sep. 20, 2022.

* cited by examiner

LINE NARROWING DEVICE, ELECTRONIC DEVICE MANUFACTURING METHOD

CROSS-REFERENCE TO RELATED APPLICATIONS

The present application is a continuation application of International Application No. PCT/JP2020/012546, filed on Mar. 19, 2020, the entire contents of which are hereby incorporated by reference.

BACKGROUND

Technical Field

The present disclosure relates to a line narrowing device and an electronic device manufacturing method.

Related Art

Recently, in a semiconductor exposure apparatus, resolving power improvement has been requested along with miniaturization and high integration of a semiconductor integrated circuit. Thus, the wavelength of light discharged from an exposure light source has been shortened. Examples of a gas laser apparatus for exposure include a KrF excimer laser apparatus configured to emit a laser beam having a wavelength of 248 nm approximately and an ArF excimer laser apparatus configured to emit a laser beam having a wavelength of 193 nm approximately.

The KrF excimer laser apparatus and the ArF excimer laser apparatus have a wide spectrum line width of 350 to 400 pm for spontaneous oscillation light. Thus, chromatic aberration occurs in some cases when a projection lens is made of a material that transmits ultraviolet light such as a KrF or ArF laser beam. As a result, resolving power potentially decreases. Thus, the spectrum line width of a laser beam emitted from such a gas laser apparatus needs to be narrowed until chromatic aberration becomes negligible. To narrow the spectrum line width, a line narrowing module (LNM) including a line narrowing element (for example, etalon or grating) is provided in a laser resonator of the gas laser apparatus in some cases. In the following description, a gas laser apparatus that achieves narrowing of the spectrum line width is referred to as a line narrowed gas laser apparatus.

LIST OF DOCUMENTS

Patent Documents

Patent Document 1: Japanese Unexamined Patent Application Publication No. 02-276283
Patent Document 2: Japanese Unexamined Patent Application Publication No. 2006-269628

SUMMARY

A line narrowing device according to an aspect of the present disclosure includes first and second prisms disposed at positions different in a wavelength dispersion direction of any of the first and second prisms, a third prism that is disposed on the optical path of an optical beam and through which the beam width of the optical beam is enlarged, a first part of the optical beam is incident on the first prism, and a second part of the optical beam is incident on the second prism, a grating disposed across the optical path of the first part having passed through the first prism and the optical path of the second part having passed through the second prism, a first actuator configured to adjust the incident angle of the first part on the grating, a second actuator configured to adjust the incident angle of the second part on the grating, and a third actuator configured to adjust an energy ratio of the first part and the second part.

A line narrowing device according to another aspect of the present disclosure includes first and second prisms disposed at positions different in a wavelength dispersion direction of any of the first and second prisms, a third prism that is disposed on the optical path of an optical beam and through which the beam width of the optical beam is enlarged, a first part of the optical beam is incident on the first prism, and a second part of the optical beam is incident on the second prism, a first grating disposed on the optical path of the first part having passed through the first prism, a second grating disposed on the optical path of the second part having passed through the second prism, a first actuator configured to adjust the incident angle of the first part on the first grating, a second actuator configured to adjust the incident angle of the second part on the second grating, and a third actuator configured to adjust an energy ratio of the first part and the second part.

An electronic device manufacturing method according to an aspect of the present disclosure includes generating a pulse laser beam with a laser apparatus, emitting the pulse laser beam to an exposure apparatus, and exposing a photosensitive substrate to the pulse laser beam in the exposure apparatus to manufacture an electronic device. The laser apparatus includes a laser chamber and an optical resonator including a line narrowing device. The line narrowing device includes first and second prisms disposed at positions different in a wavelength dispersion direction of any of the first and second prisms, a third prism that is disposed on the optical path of an optical beam and through which the beam width of the optical beam is enlarged, a first part of the optical beam is incident on the first prism, and a second part of the optical beam is incident on the second prism, a grating disposed across the optical path of the first part having passed through the first prism and the optical path of the second part having passed through the second prism, a first actuator configured to adjust the incident angle of the first part on the grating, a second actuator configured to adjust the incident angle of the second part on the grating, and a third actuator configured to adjust an energy ratio of the first part and the second part.

An electronic device manufacturing method according to another aspect of the present disclosure includes generating a pulse laser beam with a laser apparatus, emitting the pulse laser beam to an exposure apparatus, and exposing a photosensitive substrate to the pulse laser beam in the exposure apparatus to manufacture an electronic device. The laser apparatus includes a laser chamber and an optical resonator including a line narrowing device. The line narrowing device includes first and second prisms disposed at positions different in a wavelength dispersion direction of any of the first and second prisms, a third prism that is disposed on the optical path of an optical beam and through which the beam width of the optical beam is enlarged, a first part of the optical beam is incident on the first prism, and a second part of the optical beam is incident on the second prism, a first grating disposed on the optical path of the first part having passed through the first prism, a second grating disposed on the optical path of the second part having passed through the second prism, a first actuator configured to adjust the incident angle of the first part on the first grating, a second actuator configured to adjust the incident angle of the second part on the second grating, and a third actuator configured to adjust an energy ratio of the first part and the second part.

BRIEF DESCRIPTION OF THE DRAWINGS

Embodiments of the present disclosure will be described below as examples with reference to the accompanying drawings.

DESCRIPTION OF EMBODIMENTS

Contents

Figure 1:
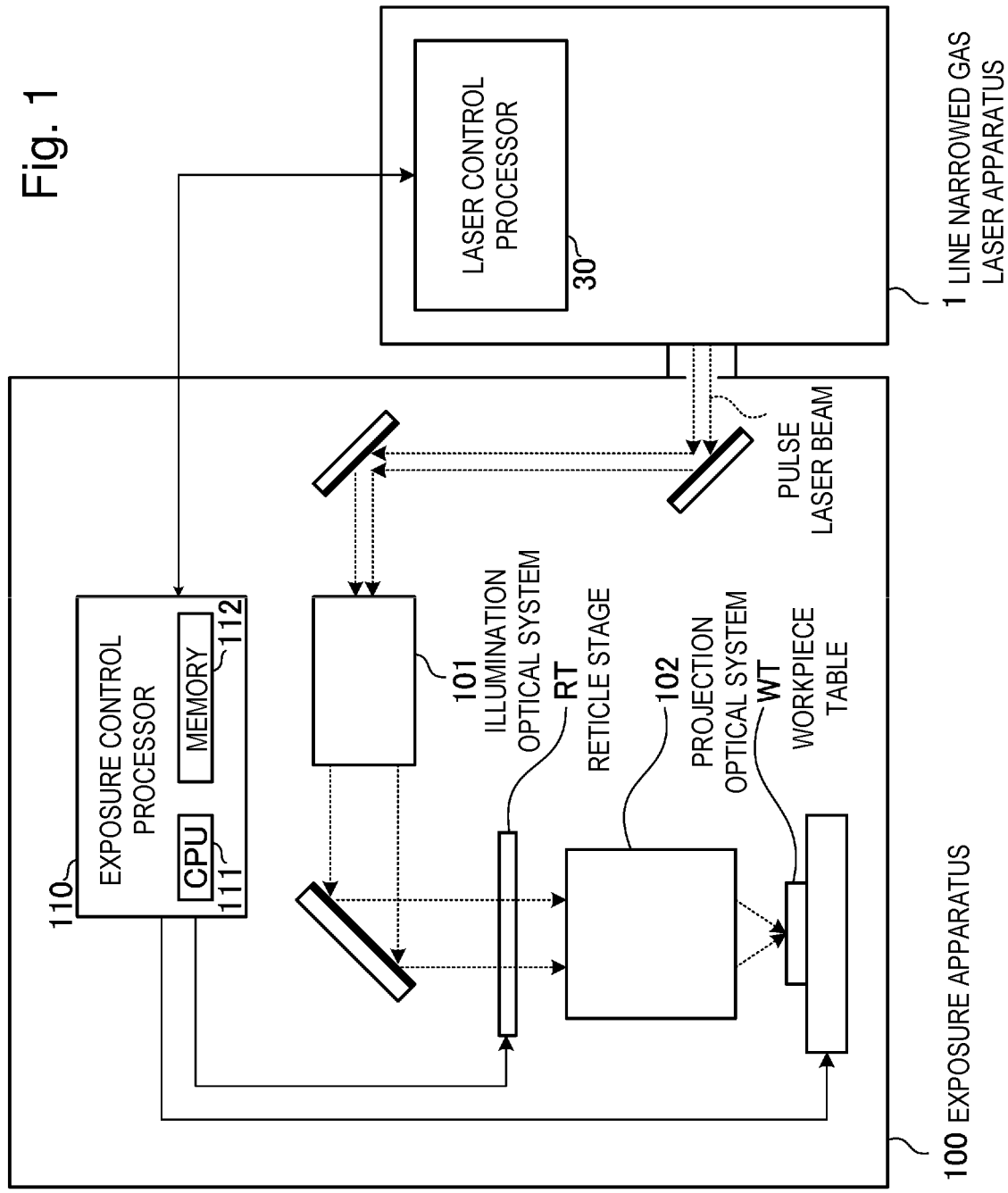
FIG. 1 schematically illustrates the configuration of an exposure system in a comparative example.

1. Comparative example
1.1 Exposure system
1.1.1 Configuration of exposure apparatus 100
1.1.2 Operation
1.2 Line narrowed gas laser apparatus
1.2.1 Configuration
1.2.1.1 Master oscillator MO
1.2.1.2 Laser control processor 30
1.2.1.3 Gas adjustment device GA
1.2.2 Operation
1.2.2.1 Laser control processor 30
1.2.2.2 Master oscillator MO
1.2.2.3 Gas adjustment device GA
1.3 Line narrowing device
1.3.1 Configuration
1.3.1.1 Prisms 41 to 44
1.3.1.2 Grating 50
1.3.2 Operation
1.3.3 Problem with comparative example
2. Line narrowing device capable of adjusting energy ratio of a plurality of wavelength components
2.1 First embodiment
2.1.1 Configuration
2.1.2 Operation
2.1.3 Other exemplary configurations
2.1.4 Effect
2.2 First modification
2.2.1 Configuration and operation
2.2.2 Effect
2.3 Second modification
2.3.1 Configuration
2.3.2 Operation
2.3.3 Other exemplary configurations
2.3.4 Effect
2.4 Third modification
2.4.1 Configuration
2.4.2 Operation
2.4.3 Other exemplary configurations
2.4.4 Effect
2.5 Fourth modification
2.5.1 Configuration
2.5.2 Operation
2.5.3 Other exemplary configurations
2.5.4 Effect
2.6 Fifth modification
2.6.1 Configuration
2.6.2 Operation
2.6.3 Other exemplary configurations
2.6.4 Effect
3. Line narrowing device including a plurality of gratings
3.1 Second embodiment
3.1.1 Configuration
3.1.2 Operation
3.1.3 Other exemplary configurations
3.1.4 Effect
3.2 Sixth modification
3.2.1 Configuration
3.2.2 Operation
3.2.3 Other exemplary configurations
3.2.4 Effect
3.3 Seventh modification
3.3.1 Configuration
3.3.2 Operation
3.3.3 Other exemplary configurations
3.3.4 Effect
4. Other Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Comparative Example 1.1 Exposure System

Figure 2:
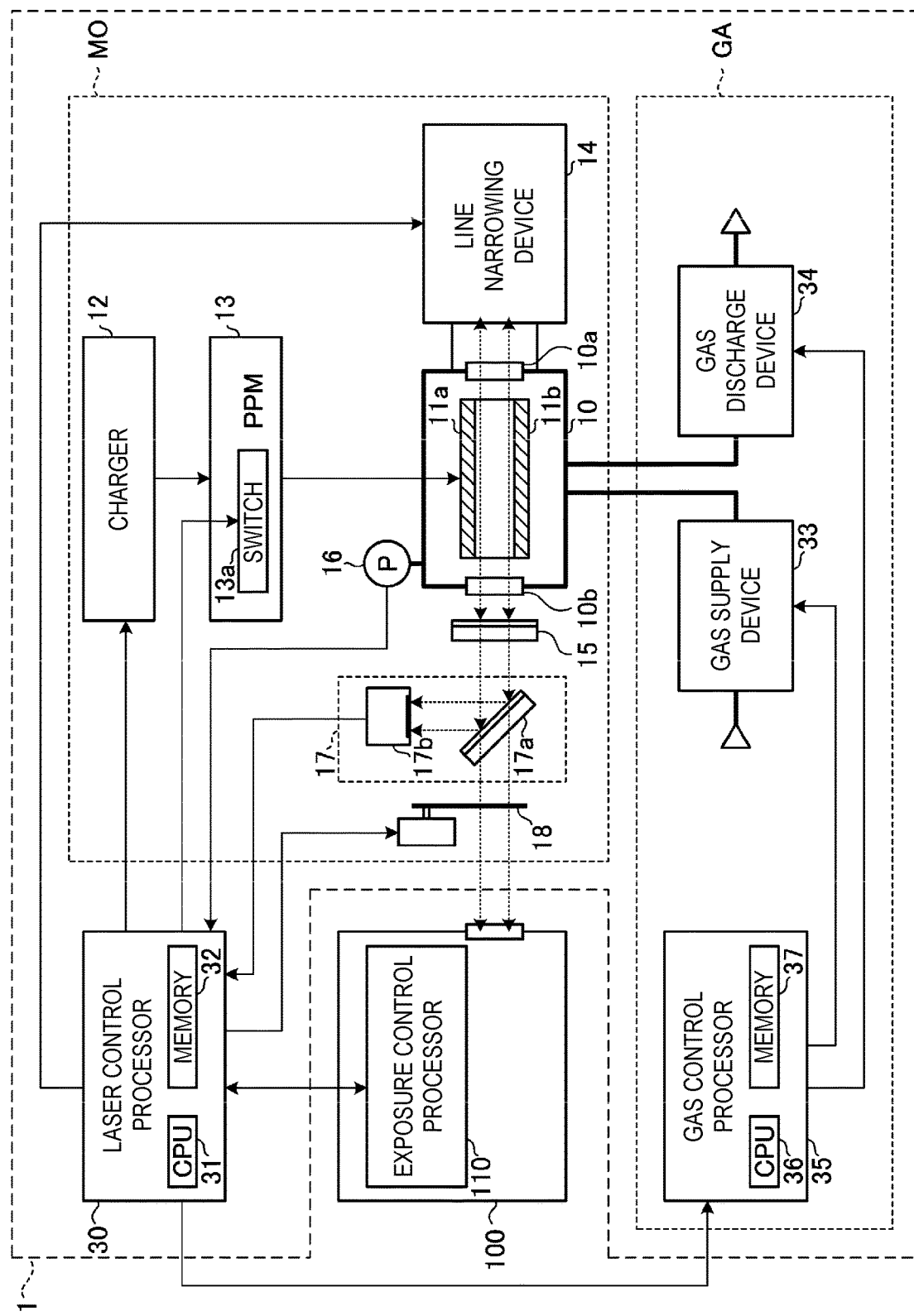
FIG. 2 schematically illustrates the configuration of the exposure system in the comparative example.

FIGS. 1 and 2 schematically illustrate the configuration of an exposure system in a comparative example. The comparative example of the present disclosure is an example that the applicant recognizes as known only by the applicant, but is not a publicly known example that is recognized by the applicant.

The exposure system includes a line narrowed gas laser apparatus 1 and an exposure apparatus 100. In FIG. 1, the line narrowed gas laser apparatus 1 is simplified. In FIG. 2, the exposure apparatus 100 is simplified.

The line narrowed gas laser apparatus 1 includes a laser control processor 30. The line narrowed gas laser apparatus 1 emits a pulse laser beam toward the exposure apparatus 100.

1.1.1 Configuration of Exposure Apparatus 100

As illustrated in FIG. 1, the exposure apparatus 100 includes an illumination optical system 101, a projection optical system 102, and an exposure control processor 110.

The illumination optical system 101 illuminates a reticle pattern of a non-illustrated reticle disposed on a reticle stage RT with the pulse laser beam incident from the line narrowed gas laser apparatus 1.

The pulse laser beam having transmitted through the reticle is imaged on a non-illustrated workpiece disposed on a workpiece table WT by reduced projection through the projection optical system 102. The workpiece is a photosensitive substrate such as a semiconductor wafer on which a resist film is applied.

The exposure control processor 110 is a processing device including a memory 112 in which a control program is stored and a central processing unit (CPU) 111 configured to execute the control program. The exposure control processor 110 is specially configured or programmed to execute various kinds of processing included in the present disclosure. The exposure control processor 110 collectively controls the exposure apparatus 100 and transmits and receives various kinds of data and various signals to and from the laser control processor 30.

1.1.2 Operation

The exposure control processor 110 transmits data of a wavelength target value, data of a pulse energy target value, and a trigger signal to the laser control processor 30. The laser control processor 30 controls the line narrowed gas laser apparatus 1 in accordance with the data and signals.

The exposure control processor 110 translates the reticle stage RT and the workpiece table WT in directions opposite to each other in synchronization. Accordingly, the workpiece is exposed to the pulse laser beam reflected by the reticle pattern.

Through such an exposure process, the reticle pattern is transferred to the semiconductor wafer. Thereafter, an electronic device can be manufactured through a plurality of processes.

1.2 Line Narrowed Gas Laser Apparatus

1.2.1 Configuration

As illustrated in FIG. 2, the line narrowed gas laser apparatus 1 includes a master oscillator MO and a gas adjustment device GA in addition to the laser control processor 30.

1.2.1.1 Master Oscillator MO

The master oscillator MO includes a laser chamber 10, a charger 12, a pulse power module (PPM) 13, a line narrowing device 14, an output coupling mirror 15, a light detector 17, and a shutter 18. The line narrowing device 14 and the output coupling mirror 15 constitute an optical resonator.

The laser chamber 10 is disposed on the optical path of the optical resonator. The laser chamber 10 is provided with windows 10a and 10b.

The laser chamber 10 includes a pair of electrodes 11a and 11b inside and houses laser gas as a laser medium. The laser medium is, for example, $F_2$, ArF, KrF, XeCl or XeF.

A pressure sensor 16 is attached to the laser chamber 10.

The charger 12 stores electric energy to be supplied to the pulse power module 13. The pulse power module 13 includes a switch 13a.

The line narrowing device 14 includes wavelength selection elements such as prisms 41 and 42 and gratings 51 and 52 to be described later.

The output coupling mirror 15 is a partially reflective mirror.

The light detector 17 includes a beam splitter 17a and a sensor unit 17b. The beam splitter 17a is disposed on the optical path of a pulse laser beam output from the output coupling mirror 15. The beam splitter 17a transmits part of the pulse laser beam at high transmittance and reflects another part of the pulse laser beam into the sensor unit 17b. The sensor unit 17b includes a spectroscopic sensor and can output wavelength measured data. The sensor unit 17b also includes an energy sensor and can output pulse energy measured data.

The shutter 18 is disposed on the optical path of the pulse laser beam having transmitted through the beam splitter 17a. When the shutter 18 is closed, the pulse laser beam having transmitted through the beam splitter 17a is cut off not to enter the exposure apparatus 100. When the shutter 18 is opened, the pulse laser beam having transmitted through the beam splitter 17a is not cut off but enters the exposure apparatus 100.

1.2.1.2 Laser Control Processor 30

The laser control processor 30 is a processing device including a memory 32 in which a control program is stored and a CPU 31 configured to execute the control program. The laser control processor 30 is specially configured or programmed to execute various kinds of processing included in the present disclosure.

1.2.1.3 Gas Adjustment Device GA

The gas adjustment device GA includes a gas supply device 33, a gas discharge device 34, and a gas control processor 35.

The gas supply device 33 includes a non-illustrated valve provided to a first pipe between the laser chamber 10 and a non-illustrated gas tank.

The gas discharge device 34 includes a non-illustrated valve, a pump, and a detoxification device provided to a second pipe connected to the laser chamber 10.

The gas control processor 35 is a processing device including a memory 37 in which a control program is stored and a CPU 36 configured to execute the control program. The gas control processor 35 is specially configured or programmed to execute various kinds of processing included in the present disclosure.

1.2.2 Operation

1.2.2.1 Laser Control Processor 30

The laser control processor 30 acquires data of a wavelength target value from the exposure control processor 110. The laser control processor 30 transmits an initial setting signal to the line narrowing device 14 based on the wavelength target value. After pulse laser beam emission is started, the laser control processor 30 receives wavelength measured data from the light detector 17 and transmits a feedback control signal to the line narrowing device 14 based on the wavelength target value and the wavelength measured data.

The laser control processor 30 acquires data of a pulse energy target value from the exposure control processor 110. The laser control processor 30 transmits an initial setting signal of charging voltage to the charger 12 based on the pulse energy target value. After pulse laser beam emission is started, the laser control processor 30 receives pulse energy measured data from the light detector 17 and transmits a feedback control signal of the charging voltage to the charger 12 based on the pulse energy target value and the pulse energy measured data.

The laser control processor 30 receives a trigger signal from the exposure control processor 110. The laser control processor 30 transmits an oscillation trigger signal based on the trigger signal to the switch 13a of the pulse power module 13.

The laser control processor 30 transmits a gas control signal to the gas control processor 35. The laser control processor 30 receives measured data of gas pressure P from the pressure sensor 16 and transmits the measured data of the gas pressure P to the gas control processor 35.

1.2.2.2 Master Oscillator MO

When having received the oscillation trigger signal from the laser control processor 30, the switch 13a is turned on. When the switch 13a is turned on, the pulse power module 13 generates high voltage in pulses from the electric energy stored in the charger 12. The pulse power module 13 applies the high voltage to the electrodes 11a and 11b.

When the high voltage is applied to the electrodes 11a and 11b, discharging occurs between the electrodes 11a and 11b. Laser gas in the laser chamber 10 is excited by energy of the discharging and transitions to a higher energy level. Thereafter, when transitioning to a lower energy level, the excited laser gas discharges light of a wavelength in accordance with the difference between the energy levels.

The light generated in the laser chamber 10 is output out of the laser chamber 10 through the windows 10a and 10b. The light output through the window 10a is incident as an optical beam on the line narrowing device 14. Light near a desired wavelength in the light incident on the line narrowing device 14 is reflected by the line narrowing device 14 and returned to the laser chamber 10.

The output coupling mirror 15 transmits and outputs part of the light output through the window 10b and reflects and returns another part thereof to the laser chamber 10.

As described above, light output from the laser chamber 10 reciprocates between the line narrowing device 14 and the output coupling mirror 15. The light is amplified each time the light passes through a discharge space between the pair of electrodes 11a and 11b. In this manner, light provided with laser oscillation and line narrowing is output as a pulse laser beam from the output coupling mirror 15.

The pulse laser beam emitted from the line narrowed gas laser apparatus 1 enters the exposure apparatus 100.

1.2.2.3 Gas Adjustment Device GA

The gas control processor 35 controls the gas supply device 33 and the gas discharge device 34 based on the gas control signal received from the laser control processor 30 and the measured data of the gas pressure P such that the gas pressure P inside the laser chamber 10 becomes a desired value.

For example, to increase the gas pressure P inside the laser chamber 10, the gas control processor 35 performs control to open the valve included in the gas supply device 33 so that laser gas is supplied into the laser chamber 10. For example, to decrease the gas pressure P inside the laser chamber 10, the gas control processor 35 performs control to open the valve included in the gas discharge device 34 so that part of laser gas inside the laser chamber 10 is discharged.

1.3 Line Narrowing Device

1.3.1 Configuration

Figure 3A:
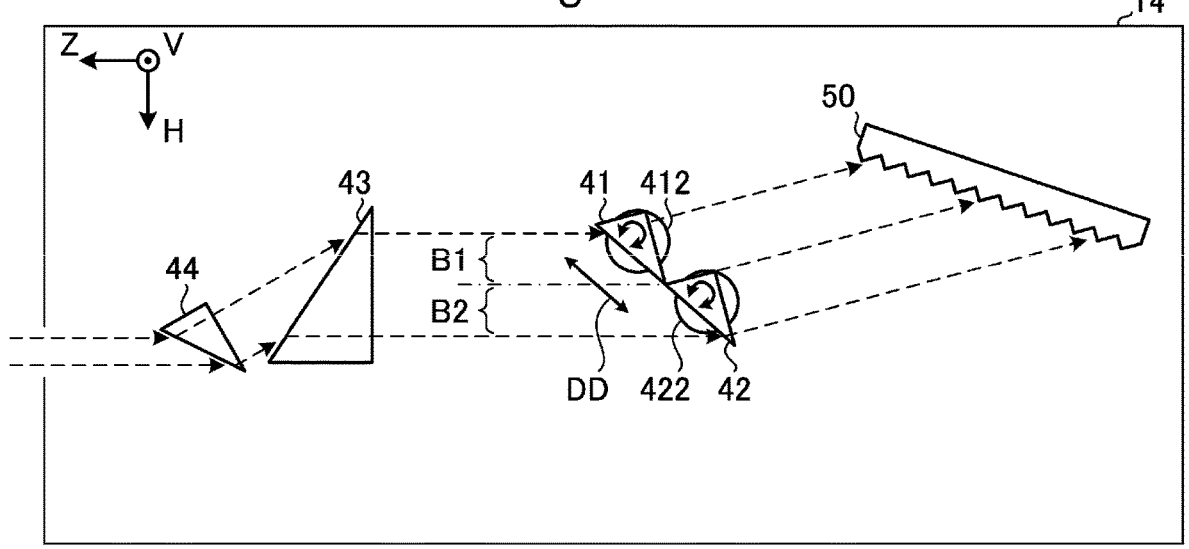
FIGS. 3A and 3B schematically illustrate the configuration of a line narrowing device in the comparative example.
Figure 3B:
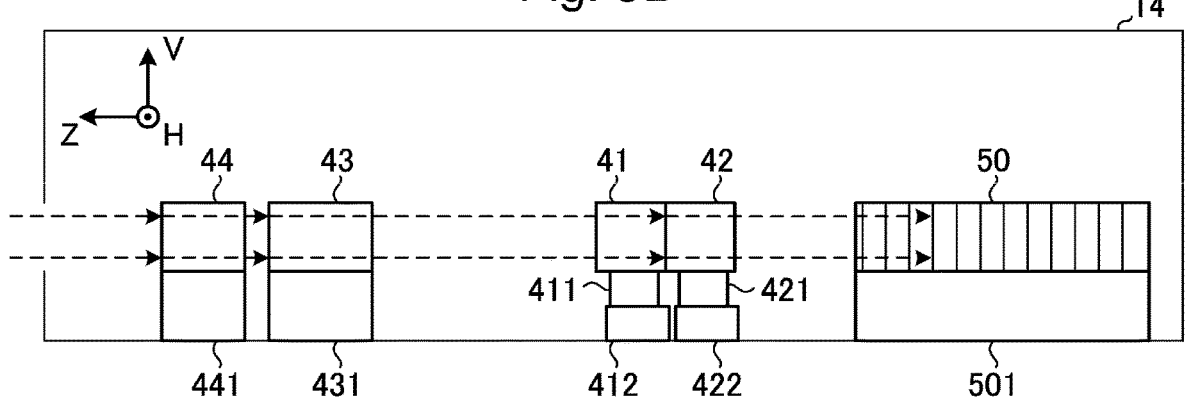

FIGS. 3A and 3B schematically illustrate the configuration of the line narrowing device 14 in the comparative example. A V axis, an H axis, and a Z axis that are orthogonal to one another are illustrated in each drawing. FIG. 3A illustrates the line narrowing device 14 viewed in the −V direction, and FIG. 3B illustrates the line narrowing device 14 viewed in the −H direction. The −V direction and the +V direction match directions in which the electrodes 11a and 11b (refer to FIG. 2) face each other. The −Z direction matches the traveling direction of an optical beam output from the window 10a. The +Z direction matches the traveling direction of a pulse laser beam output from the window 10b and then output through the output coupling mirror 15.

The line narrowing device 14 includes prisms 41 to 44 and a grating 50.

1.3.1.1 Prisms 41 to 44

The prism 44 is disposed on the optical path of the optical beam output from the window 10a. The prism 44 is supported by a holder 441.

The prism 43 is disposed on the optical path of the optical beam having passed through the prism 44. The prism 43 corresponds to a third prism in the present disclosure. The prism 43 is supported by a holder 431.

The prisms 41 and 42 are disposed at positions different from each other in a wavelength dispersion direction DD of any of the prisms 41 and 42 on the optical path of the optical beam having passed through the prism 43. The prism 41 corresponds to a first prism in the present disclosure, and the prism 42 corresponds to a second prism in the present disclosure. The prism 41 is supported by a holder 411, and the prism 42 is supported by a holder 421. The positions of the prisms 41 and 42 are set such that the optical beam having passed through the prism 43 is incident across the prisms 41 and 42. The wavelength dispersion direction DD of a prism is a direction in which the refraction angle of light on the surface of the prism disperses in accordance with the wavelength. In the example illustrated in FIGS. 3A and 3B, the prisms 41 and 42 have the same wavelength dispersion direction DD.

The prisms 41 to 44 are made of a material such as calcium fluoride or synthetic quartz, which has a high transmittance for a wavelength selected by the line narrowing device 14.

The prisms 41 to 44 are disposed such that surfaces of the prisms 41 to 44 that the optical beam is incident on and output from are all parallel to the V axis. The prism 41 is rotatable about an axis parallel to the V axis by a rotation stage 412, and the prism 42 is rotatable about an axis parallel to the V axis by a rotation stage 422.

1.3.1.2 Grating 50

The grating 50 is disposed across both the optical path of a first part B1 of the optical beam having passed through the prism 41 and the optical path of a second part B2 of the optical beam having passed through the prism 42. The direction of grooves of the grating 50 matches the direction of the V axis. The grating 50 is supported by a holder 501.

1.3.2 Operation

The traveling direction of the optical beam output from the window 10a is changed in a plane parallel to an HZ plane that is orthogonal to the V axis by each of the prisms 44 and 43, and the beam width of the optical beam is expanded in the plane parallel to the HZ plane. The traveling direction of the optical beam having passed through both the prisms 44 and 43 and traveling toward the prisms 41 and 42 substantially matches the −Z direction, for example.

The first part B1 of the optical beam having passed through the prism 43 is incident on the prism 41, and the second part B2 thereof is incident on the prism 42. The incident angles of the optical beams incident on the prisms 41 and 42 depend on the postures of the prisms 41 and 42, respectively. The traveling directions of the optical beams incident on the prisms 41 and 42 are changed in accordance with the postures of the prisms 41 and 42, respectively, and the optical beams are output toward the grating 50.

The light incident on the grating 50 from the prisms 41 and 42 is reflected by the grooves of the grating 50 and diffracted in a direction in accordance with the wavelength of the light. Accordingly, the light reflected by the grooves of the grating 50 is dispersed in a plane parallel to the HZ plane. The prism 41 is disposed in such a posture that the incident angle of the first part B1 of the optical beam incident on the grating 50 from the prism 41 matches the diffracting angle of light of a desired first wavelength within the light diffracted by the grating 50. The prism 42 is disposed in such a posture that the incident angle of the second part B2 of the optical beam incident on the grating 50 from the prism 42 matches the diffracting angle of light of a desired second wavelength within the light diffracted by the grating 50. When the incident angles of the optical beams incident on the grating 50 from the prisms 41 and 42 are different from each other, a wavelength difference occurs between the first wavelength of the diffracted light returned from the grating 50 to the prism 41 and the second wavelength of the diffracted light returned from the grating 50 to the prism 42.

Although only optical beams in a direction from the prism 44 to the grating 50 are illustrated with dashed line arrows in FIGS. 3A and 3B, an optical beam of a wavelength selected by the line narrowing device 14 travels from the grating 50 toward the prism 44 through paths opposite to these dashed line arrows.

The prisms 41 to 44 reduce the beam width of light returned from the grating 50 in a plane parallel to the HZ plane and return the light into the laser chamber 10 through the window 10a.

The rotation stages 412 and 422 are controlled by the laser control processor 30 (refer to FIG. 2).

When the rotation stage 412 slightly rotates the prism 41, the traveling direction of the first part B1 of the optical beam output from the prism 41 toward the grating 50 slightly changes in a plane parallel to the HZ plane. Accordingly, the incident angle of the first part B1 of the optical beam incident on the grating 50 from the prism 41 slightly changes. As a result, the first wavelength changes.

When the rotation stage 422 slightly rotates the prism 42, the traveling direction of the second part B2 of the optical beam output from the prism 42 toward the grating 50 slightly changes in a plane parallel to the HZ plane. Accordingly, the incident angle of the second part B2 of the optical beam incident on the grating 50 from the prism 42 slightly changes. As a result, the second wavelength changes.

With the above-described configuration and operation, light of the first wavelength and light of the second wavelength in an optical beam output from the window 10a of the laser chamber 10 are selected and returned into the laser chamber 10. Accordingly, the line narrowed gas laser apparatus 1 can perform two-wavelength oscillation. The first wavelength and the second wavelength can be separately set by controlling the rotation stages 412 and 422.

A focal length in the exposure apparatus 100 (refer to FIG. 1) depends on the wavelength of a pulse laser beam. A pulse laser beam subjected to two-wavelength oscillation and emitted from the line narrowed gas laser apparatus 1 can be imaged on the workpiece table WT of the exposure apparatus 100 at two positions that are different from each other in the direction of the optical path axis of the pulse laser beam, and a focal point depth can be increased in effect. For example, when a resist film having a large film thickness is exposed, variance of imaging performance in the thickness direction of the resist film can be suppressed.

1.3.3 Problem with Comparative Example

In the comparative example, the first wavelength and the second wavelength can be separately set, but it has been sometimes not easy to obtain a desired sectional shape of a resist film when the resist film is exposed and developed. For example, it has been sometimes occurred that a resist wall surface as a boundary surface between a part at which the resist film is removed through exposure and image development and a part at which the resist film is left on a semiconductor wafer is oblique relative to the surface of the semiconductor wafer when the resist wall surface is desirably closely perpendicular to the surface of the semiconductor wafer.

According to embodiments describes below, it is possible to adjust the energy ratio of a first wavelength component and a second wavelength component included in a pulse laser beam. Since the energy ratio is adjustable, it is possible to adjust balance of an exposure state in the thickness direction of a resist film.

Figure 4A:
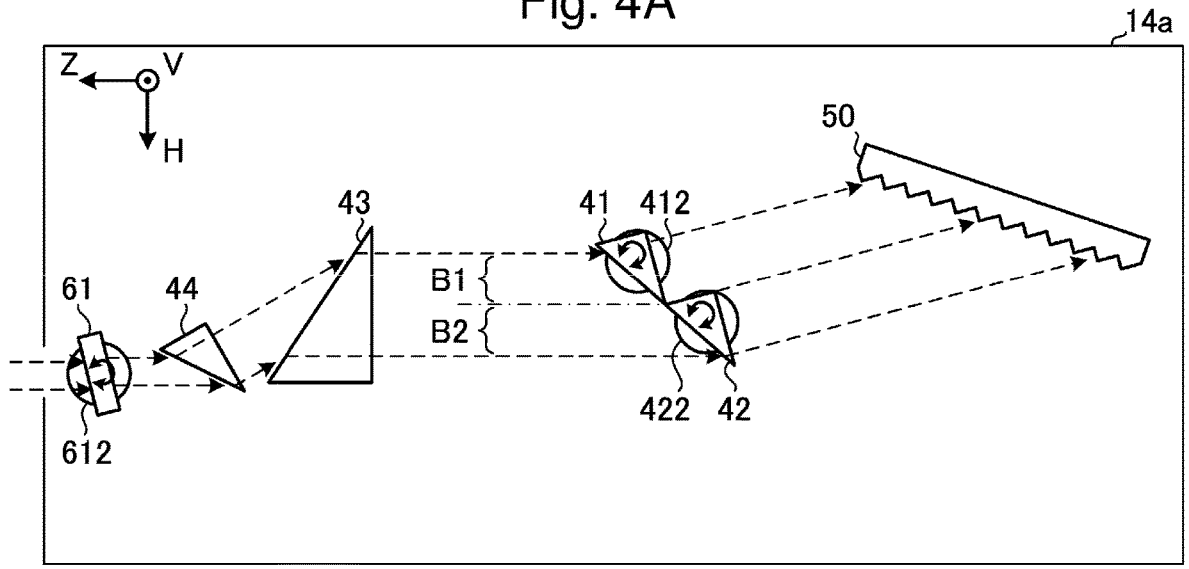
FIGS. 4A and 4B schematically illustrate the configuration of a line narrowing device in a first embodiment.
Figure 4B:
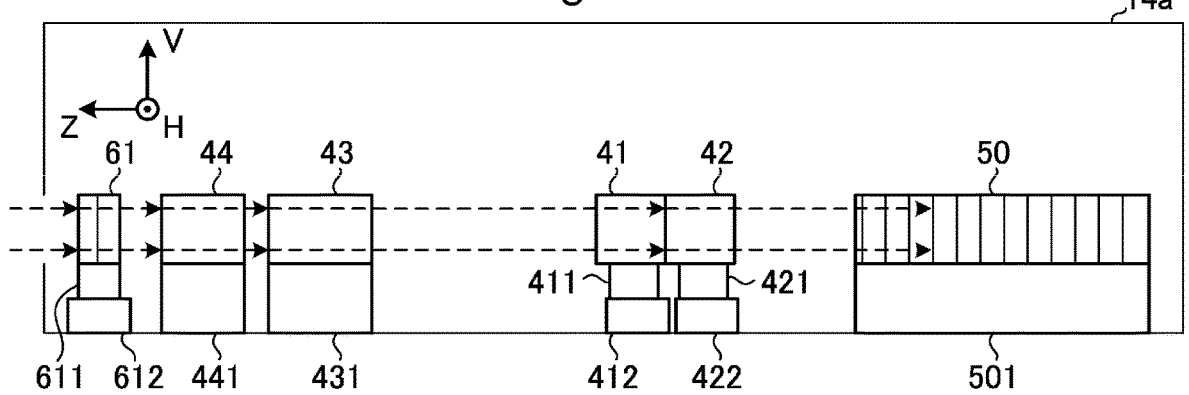

2. Line Narrowing Device Capable of Adjusting Energy Ratio of a Plurality of Wavelength Components 2.1 First Embodiment 2.1.1 Configuration FIGS. 4A and 4B schematically illustrate the configuration of a line narrowing device 14a in a first embodiment. FIG. 4A illustrates the line narrowing device 14a viewed in the −V direction, and FIG. 4B illustrates the line narrowing device 14a viewed in the −H direction.

The line narrowing device 14a includes a parallel plane substrate 61 as a beam shift optical system.

The parallel plane substrate 61 is disposed on the optical path of the optical beam output from the window 10a. For example, the parallel plane substrate 61 is disposed on the optical path of the optical beam between the window 10a and the prism 44. The parallel plane substrate 61 is supported by a holder 611. The parallel plane substrate 61 is made of a material such as calcium fluoride or synthetic quartz. The parallel plane substrate 61 is disposed such that surfaces of the parallel plane substrate 61 that the optical beam is incident on and output from are all parallel to the V axis. The parallel plane substrate 61 is rotatable about an axis parallel to the V axis by a rotation stage 612. In the first embodiment, the rotation stage 612 corresponds to a third actuator in the present disclosure.

2.1.2 Operation

The parallel plane substrate 61 refracts the optical beam at the same angle in directions opposite to each other at the surface on which the optical beam output from the window 10a is incident and at the surface from which the optical beam is output toward the prism 44, and transmits the optical beam. Thus, the traveling direction of the optical beam output from the parallel plane substrate 61 is same as that of the optical beam incident on the parallel plane substrate 61, and the optical path axis thereof is shifted in the direction of the H axis in accordance with the posture of the parallel plane substrate 61. The optical path axis is the central axis of the optical path.

The optical beam having transmitted through the parallel plane substrate 61 is incident on the prism 44 and thereafter incident on the prism 43. The prisms 44 and 43 expand the beam width of the optical beam in a plane parallel to the HZ plane when transmitting the optical beam. Through the prism 43, the first part B1 of the optical beam is incident on the prism 41 and the second part B2 of the optical beam is incident on the prism 42.

The first part B1 transmits inside the prism 41 and enters the grating 50. The second part B2 transmits inside the prism 42 and enters the grating 50.

When the rotation stage 612 changes the posture of the parallel plane substrate 61, the shift amount of the optical beam in the direction of the H axis when the optical beam passes through the parallel plane substrate 61 changes, and positions at which the optical beam incident on the prisms 41 to 44 each change in the direction of the H axis. Accordingly, the energy ratio of the first part B1 and the second part B2 changes. For example, the energy ratio of the first part B1 decreases when the parallel plane substrate 61 is rotated clockwise in FIG. 4A, and the energy ratio of the first part B1 increases when the parallel plane substrate 61 is rotated anticlockwise. In this manner, the energy ratio of the first wavelength component and the second wavelength component of a pulse laser beam can be adjusted.

The exposure control processor 110 (refer to FIG. 2) transmits a target value of the first wavelength, a target value of the second wavelength, and a target value of the energy ratio to the laser control processor 30.

The laser control processor 30 controls the rotation stage 412 based on the target value of the first wavelength. Accordingly, the rotation stage 412 changes the posture of the prism 41, thereby adjusting the incident angle (first incident angle) of the first part B1 of the optical beam on the grating 50.

The laser control processor 30 controls the rotation stage 422 based on the target value of the second wavelength. Accordingly, the rotation stage 422 changes the posture of the prism 42, thereby adjusting the incident angle (second incident angle) of the second part B2 of the optical beam on the grating 50.

The laser control processor 30 controls the rotation stage 612 based on the target value of the energy ratio. Accordingly, the rotation stage 612 adjusts the posture of the parallel plane substrate 61, thereby adjusting the energy ratio of the first part B1 and the second part B2 of the optical beam.

2.1.3 Other Exemplary Configurations

In the first embodiment, the parallel plane substrate 61 is disposed on the optical path of the optical beam between the window 10a and the prism 44, but the present disclosure is not limited thereto. The parallel plane substrate 61 may be disposed between the prism 44 and the prism 43 or between the prism 43 and the prisms 41 and 42.

In the first embodiment, the parallel plane substrate 61 that is rotatable about an axis parallel to the V axis is indicated as a beam shift optical system that shifts the optical path axis of the optical beam in the direction of the H axis, but the present disclosure is not limited thereto. A plurality of prisms (not illustrated) each having incident and emission surfaces parallel to the direction of the V axis may be provided in combination such that the optical path axis of the optical beam is shifted in the direction of the H axis. The shift amount in the direction of the H axis may be changed by changing the position of at least one of the prisms.

2.1.4 Effect

In the line narrowing device 14a includes: the prisms 41 and 42 disposed at positions different in the wavelength dispersion direction DD (refer to FIGS. 3A and 3B); the prism 43 through which the beam width of the optical beam is enlarged, the first part B1 of the optical beam is incident on the prism 41, and the second part B2 of the optical beam is incident on the prism 42; and the grating 50 disposed across the optical path of the first part B1 having passed through the prism 41 and the optical path of the second part B2 having passed through the prism 42. The rotation stage 412 as a first actuator rotates the prism 41 to adjust the first incident angle of the first part B1 of the optical beam on the grating 50, and the rotation stage 422 as a second actuator rotates the prism 42 to adjust the second incident angle of the second part B2 of the optical beam on the grating 50. The rotation stage 612 as the third actuator adjusts the energy ratio of the first part B1 and the second part B2. Accordingly, the energy ratio of the first wavelength component and the second wavelength component of a pulse laser beam emitted from the line narrowed gas laser apparatus 1 can be adjusted. The pulse laser beam can be used to obtain a desired sectional shape of a resist film through exposure.

In the first embodiment, the line narrowing device 14a includes the parallel plane substrate 61 as the beam shift optical system. The beam shift optical system is disposed on the optical path of the optical beam and transmits the optical beam such that the optical beam is incident on the prism 44 and thereafter incident on the prism 43. The beam shift optical system changes the position of the optical beam incident on the prism 43 from the beam shift optical system in a direction intersecting a VZ plane parallel to both the optical path axis of the optical beam and the grooves of the grating 50 by changing the posture of the parallel plane substrate 61 as at least one optical element included in the beam shift optical system by the rotation stage 612. Accordingly, it is possible to adjust the energy ratio of the first part B1 and the second part B2 with a simple configuration, thereby adjusting the energy ratio of the first wavelength component and the second wavelength component of a pulse laser beam emitted from the line narrowed gas laser apparatus 1.

2.2 First Modification 2.2.1 Configuration and Operation

Figure 5A:
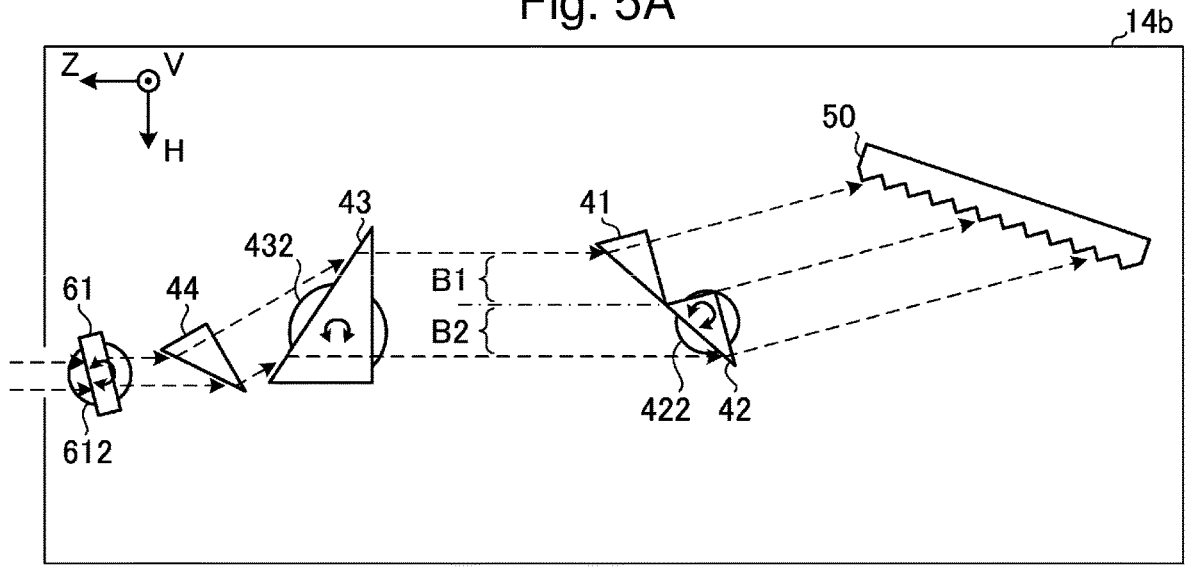
FIGS. 5A and 5B schematically illustrate the configuration of a line narrowing device in a first modification.
Figure 5B:
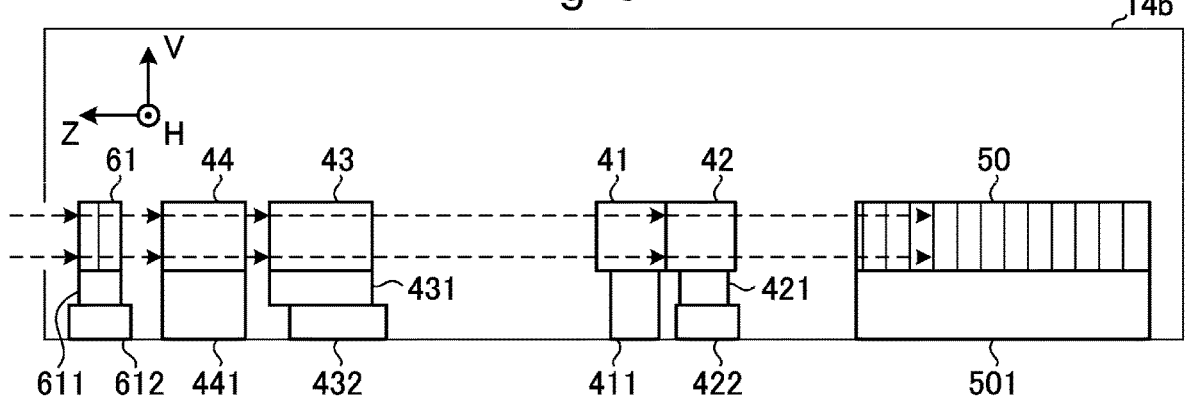

FIGS. 5A and 5B schematically illustrate the configuration of a line narrowing device 14b in a first modification. FIG. 5A illustrates the line narrowing device 14b viewed in the −V direction, and FIG. 5B illustrates the line narrowing device 14b viewed in the −H direction.

In the line narrowing device 14b, the prism 43 is rotatable about an axis parallel to the V axis by a rotation stage 432. In the first modification, the rotation stage 432 corresponds to the first actuator in the present disclosure.

In the line narrowing device 14b, the prism 41 is supported to maintain a constant posture.

The other configuration and operation of the first modification are same as the configuration and operation of the first embodiment described with reference to FIGS. 4A and 4B.

2.2.2 Effect

In the first modification, the rotation stage 432 as the first actuator rotates the prism 43. Accordingly, the incident angle of the optical beam incident on the grating 50 from the prism 43 through the prisms 41 and 42 changes. As a result, the first wavelength and the second wavelength both change. In addition, as the rotation stage 422 rotates the prism 42, the second wavelength changes, and thus the wavelength difference between the first wavelength and the second wavelength can be changed. Accordingly, the first wavelength and the second wavelength can be made closer to their target values by controlling both the rotation stages 422 and 432.

When the prism 43 is rotated, positions at which the optical beam is incident on the prisms 41 and 42 from the prism 43 change. Accordingly, when the prism 43 is rotated, the energy ratio of the first part B1 and the second part B2 changes. When the energy ratio of the first part B1 and the second part B2 exceeds an allowable range as the prism 43 is rotated, the energy ratio of the first part B1 and the second part B2 may be adjusted by controlling the posture of the parallel plane substrate 61.

2.3 Second Modification

2.3.1 Configuration

Figure 6A:
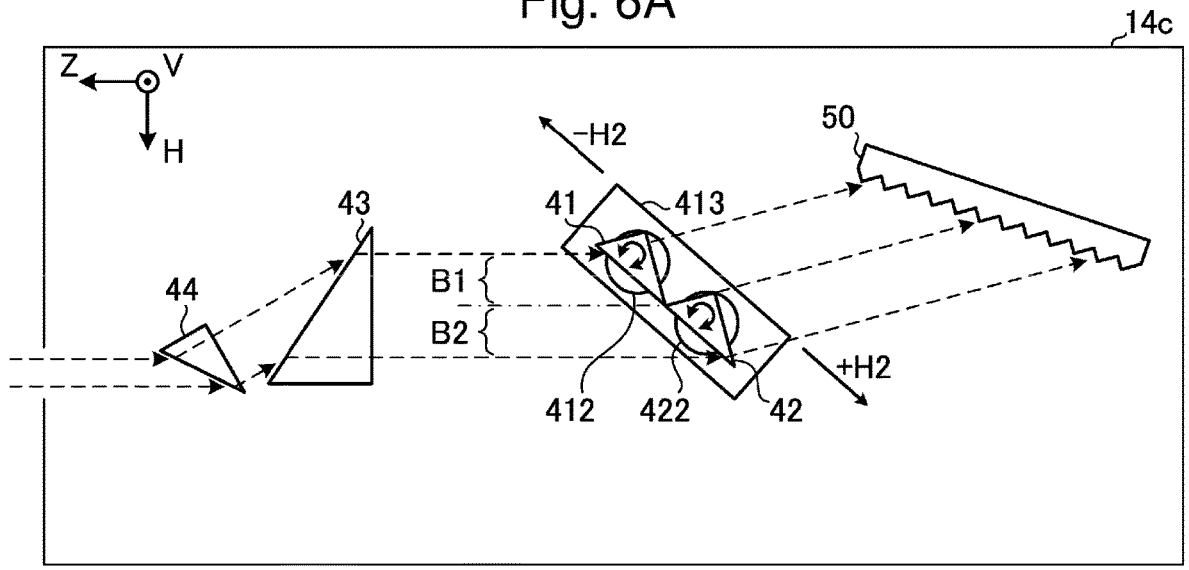
FIGS. 6A and 6B schematically illustrate the configuration of a line narrowing device in a second modification.
Figure 6B:
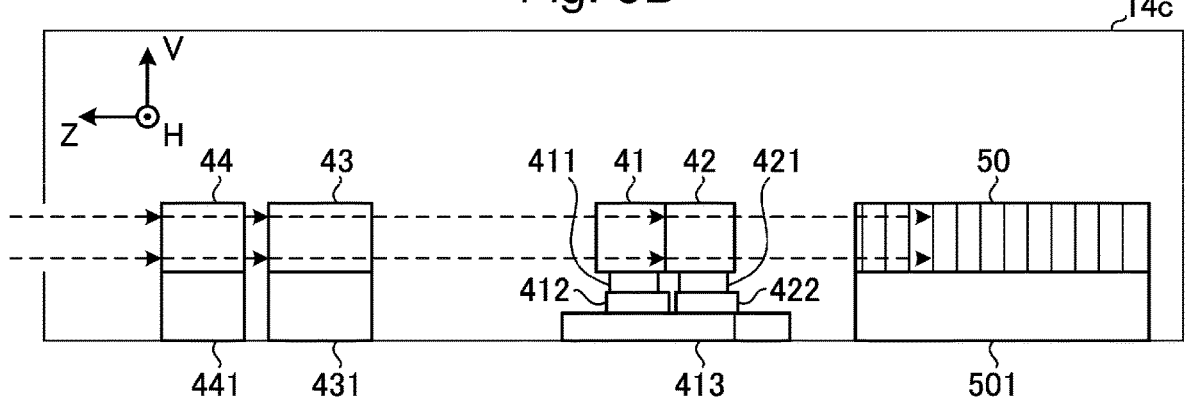

FIGS. 6A and 6B schematically illustrate the configuration of a line narrowing device 14c in a second modification. FIG. 6A illustrates the line narrowing device 14c viewed in the −V direction, and FIG. 6B illustrates the line narrowing device 14c viewed in the −H direction.

The line narrowing device 14c includes a linear stage 413.

The linear stage 413 moves the prisms 41 and 42 integrally with the holders 411 and 421 and the rotation stages 412 and 422, respectively. The prisms 41 and 42 are moved by the linear stage 413 in a direction intersecting the VZ plane. The direction intersecting the VZ plane is a direction intersecting a plane parallel to both the optical path axis of the optical beam incident on the prisms 41 and 42 from the prism 43 and the grooves of the grating 50, and is for example, the wavelength dispersion direction DD of any of the prisms 41 and 42 (refer to FIGS. 3A and 3B).

In the second modification, the linear stage 413 corresponds to the third actuator in the present disclosure. In the second modification, no parallel plane substrate 61 (refer to FIGS. 4A and 4B) may be provided.

2.3.2 Operation

As the linear stage 413 moves the prisms 41 and 42, the energy ratio of the first part B1 incident on the prism 41 and the second part B2 incident on the prism 42 within the optical beam output from the prism 43 changes. For example, the energy ratio of the first part B1 decreases as the prisms 41 and 42 are moved in the −H2 direction, and the energy ratio of the first part B1 increases as the prisms 41 and 42 are moved in the +H2 direction.

The other configuration and operation of the second modification are same as the configuration and operation of the first embodiment.

2.3.3 Other Exemplary Configurations

In the second modification, the prisms 41 and 42 are rotatable whereas the prism 43 is maintained at a constant posture, but the present disclosure is not limited thereto. In the second modification, similarly to the first modification, the prisms 42 and 43 may be rotatable whereas the prism 41 is maintained at a constant posture.

2.3.4 Effect

In the second modification, the linear stage 413 as the third actuator moves the prisms 41 and 42 in the direction intersecting the VZ plane parallel to both the optical path axis of the optical beam incident on the prisms 41 and 42 from the prism 43 and the grooves of the grating 50. Accordingly, the energy ratio of the first wavelength component and the second wavelength component of a pulse laser beam can be adjusted without the parallel plane substrate 61.

2.4 Third Modification

2.4.1 Configuration

Figure 7A:
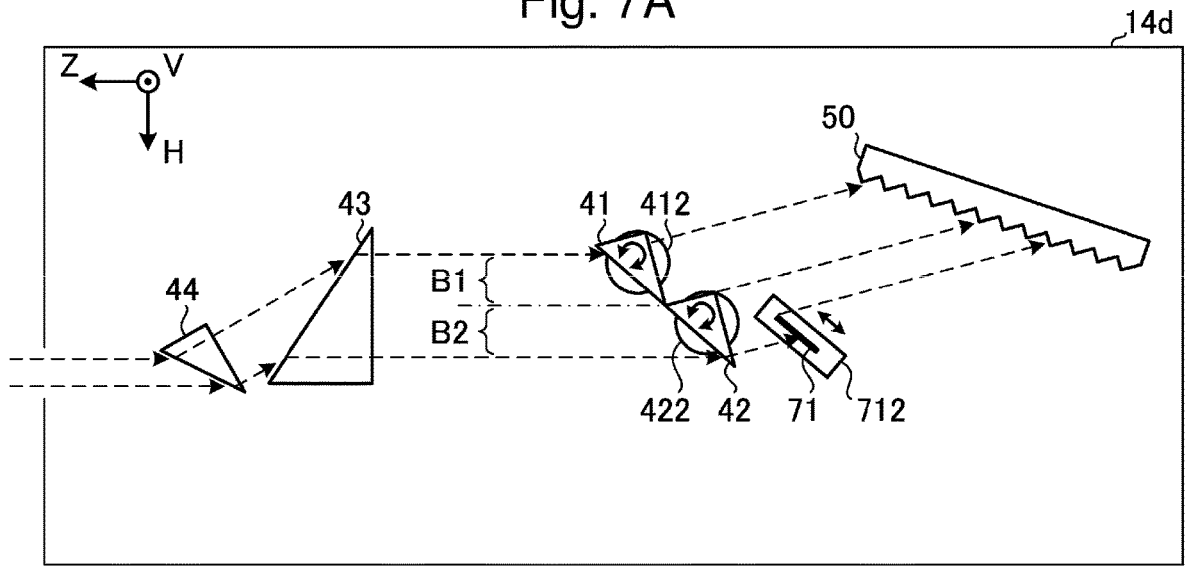
FIGS. 7A and 7B schematically illustrate the configuration of a line narrowing device in a third modification.
Figure 7B:
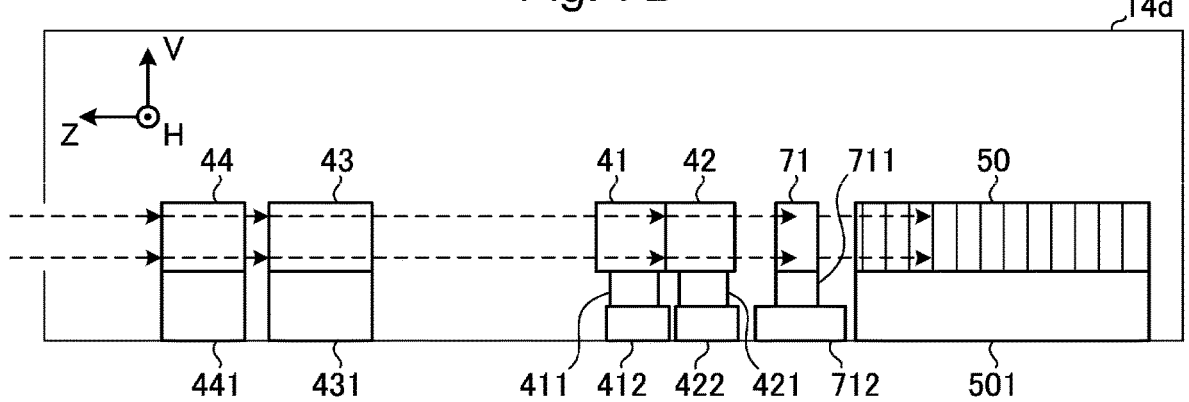

FIGS. 7A and 7B schematically illustrate the configuration of a line narrowing device 14d in a third modification. FIG. 7A illustrates the line narrowing device 14d viewed in the −V direction, and FIG. 7B illustrates the line narrowing device 14d viewed in the −H direction.

The line narrowing device 14d includes a light-shielding plate 71.

The light-shielding plate 71 is disposed to overlap part of a section of the optical path of the second part B2 of the optical beam having passed through the prism 42. The light-shielding plate 71 is supported by a holder 711. The light-shielding plate 71 can be moved by a linear stage 712 in a direction intersecting the optical path axis of the second part B2.

In the third modification, the linear stage 712 corresponds to the third actuator in the present disclosure. In the third modification, no parallel plane substrate 61 may be provided.

2.4.2 Operation

The light-shielding plate 71 absorbs part of the second part B2 of the optical beam or reflects the part out of the optical path of the optical beam. Accordingly, energy of the second part B2 incident on the grating 50 decreases as compared to a configuration in which no light-shielding plate 71 is provided.

As the linear stage 712 moves the position of the light-shielding plate 71, energy of the second part B2 incident on the grating 50 changes through the movement. Accordingly, the energy ratio of the first part B1 and the second part B2 can be adjusted. When the entire section of the optical path of the second part B2 is shielded by the light-shielding plate 71, the energy ratio of the second part B2 is zero and laser oscillation can be performed in a one-wavelength mode. When the light-shielding plate 71 is entirely retracted from the second part B2, the energy ratio of the second part B2 is maximized.

The other configuration and operation of the third modification are same as the configuration and operation of the first embodiment.

2.4.3 Other Exemplary Configurations

In the third modification, the light-shielding plate 71 is disposed on the optical path of the second part B2 of the optical beam between the prism 42 and the grating 50, but the present disclosure is not limited thereto. The light-shielding plate 71 may be disposed on the optical path of the second part B2 of the optical beam between the prism 43 and the prism 42.

In the third modification, the prisms 41 and 42 are rotatable whereas the prism 43 is maintained at a constant posture, but the present disclosure is not limited thereto. In the third modification, similarly to the first modification, the prisms 42 and 43 may be rotatable whereas the prism 41 is maintained at a constant posture. Alternatively, the prisms 41 and 43 may be rotatable whereas the prism 42 is maintained at a constant posture.

2.4.4 Effect

In the third modification, the line narrowing device 14d includes the light-shielding plate 71 disposed to overlap part of the section of the optical path of the second part B2 of the optical beam. The linear stage 712 as the third actuator moves the light-shielding plate 71 in the direction intersecting the optical path axis of the second part B2. Accordingly, the energy ratio of the first part B1 and the second part B2 can be adjusted without the parallel plane substrate 61.

2.5 Fourth Modification

2.5.1 Configuration

Figure 8A:
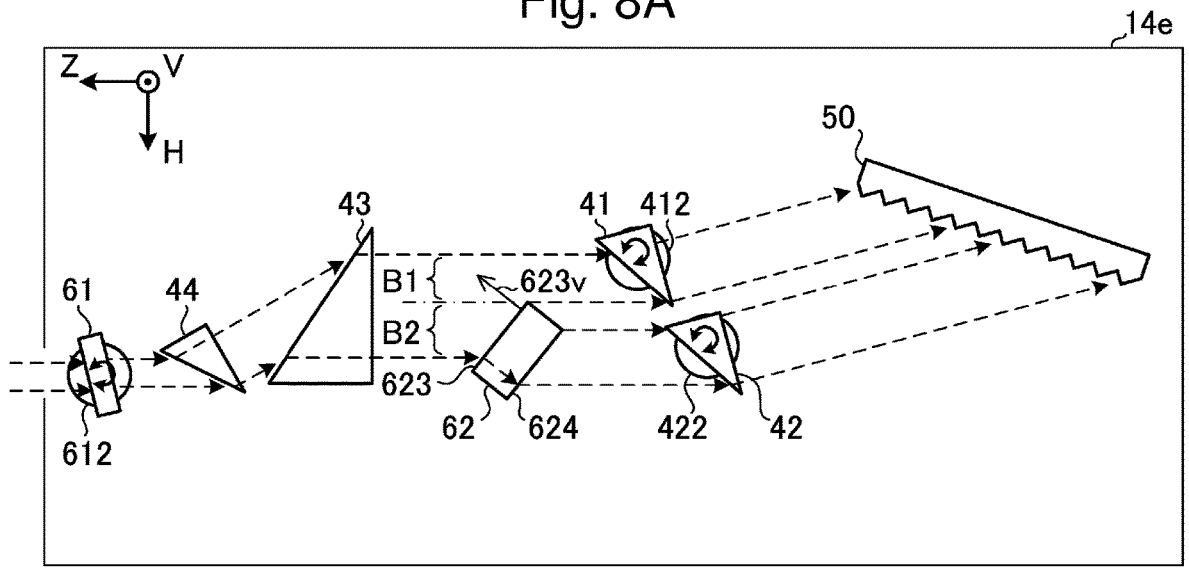
FIGS. 8A and 8B schematically illustrate the configuration of a line narrowing device in a fourth modification.
Figure 8B:
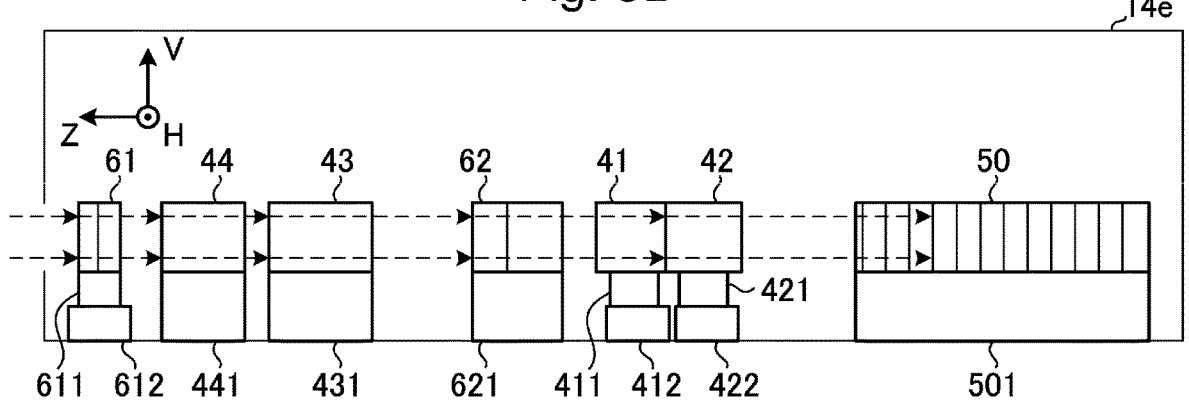

FIGS. 8A and 8B schematically illustrate the configuration of a line narrowing device 14e in a fourth modification. FIG. 8A illustrates the line narrowing device 14e viewed in the −V direction, and FIG. 8B illustrates the line narrowing device 14e viewed in the −H direction. The line narrowing device 14e includes a parallel plane substrate 62 in addition to the parallel plane substrate 61. The parallel plane substrate 62 corresponds to a beam separation optical system in the present disclosure.

The parallel plane substrate 62 is disposed to overlap part of a section of the optical path of the optical beam having passed through the prism 43. The parallel plane substrate 62 is disposed on the optical path of the second part B2 of the optical beam between the prism 43 and the prism 42. The parallel plane substrate 62 is supported by a holder 621. The parallel plane substrate 62 is made of a material such as calcium fluoride or synthetic quartz.

The parallel plane substrate 62 has an incident surface 623 on which part of the optical beam having passed through the prism 43 is incident, and an emission surface 624 from which the light incident on the parallel plane substrate 62 through the incident surface 623 is output from inside the parallel plane substrate 62 toward the prism 42. The incident surface 623 and the emission surface 624 are both parallel to the V axis and parallel to each other. The incident surface 623 and the emission surface 624 are tilted relative to the incident direction of the optical beam to refract the optical beam. Specifically, the incident surface 623 has a normal vector 623v parallel to the HZ plane and having directional components in the −H direction and the +Z direction.

2.5.2 Operation

The first part B1 of the optical beam having passed through the prism 43 passes outside the parallel plane substrate 62 and enters the prism 41. The second part B2 of the optical beam transmits inside the parallel plane substrate 62 and enters the prism 42. Specifically, the line narrowing device 14e including the parallel plane substrate 62 causes the first part B1 of the optical beam to enter the prism 41 and causes the second part B2 of the optical beam to enter the prism 42. In this case, the parallel plane substrate 62 shifts the optical path axis of the second part B2 of the optical beam relative to the optical path axis of the first part B1 of the optical beam in the +H direction. In this manner, the parallel plane substrate 62 separates the second part B2 from the first part B1 of the optical beam by transmitting part of the optical beam.

When the rotation stage 612 changes the posture of the parallel plane substrate 61, the energy ratio of the first part B1 and the second part B2 changes. For example, the energy ratio of the first part B1 decreases when the parallel plane substrate 61 is rotated clockwise in FIG. 8A, and the energy ratio of the first part B1 increases when the parallel plane substrate 61 is rotated anticlockwise. Accordingly, the energy ratio of the first wavelength component and the second wavelength component of a pulse laser beam can be adjusted.

The other configuration and operation of the fourth modification are same as the configuration and operation of the first embodiment.

2.5.3 Other Exemplary Configurations

In the fourth modification, the prisms 41 and 42 are rotatable whereas the prism 43 is maintained at a constant posture, but the present disclosure is not limited thereto. In the fourth modification, similarly to the first modification, the prisms 42 and 43 may be rotatable whereas the prism 41 is maintained at a constant posture. Alternatively, the prisms 41 and 43 may be rotatable whereas the prism 42 is maintained at a constant posture.

In the fourth modification, the energy ratio of the first part B1 and the second part B2 is adjusted by adjusting the posture of the parallel plane substrate 61, but the present disclosure is not limited thereto. The energy ratio of the first part B1 and the second part B2 may be adjusted by integrally moving the prisms 41 and 42 and the parallel plane substrate 62. Alternatively, similarly to the third modification, the energy ratio of the first part B1 and the second part B2 may be adjusted by moving the light-shielding plate 71 disposed to overlap part of the section of the optical path of the optical beam.

2.5.4 Effect

In the fourth modification, the line narrowing device 14e includes the parallel plane substrate 62 as the beam separation optical system disposed to overlap part of the section of the optical path of the optical beam having passed through the prism 43. The beam separation optical system separates the second part B2 from the first part B1 by transmitting part of the optical beam. This can suppress waste of the optical beam incident between the prism 41 and the prism 42. Moreover, the prisms 41 and 42 can be disposed at an interval from each other, and thus the prisms 41 and 42 can be each disposed outside the rotation radius of the other prism when the prisms 41 and 42 are rotated.

2.6 Fifth Modification

2.6.1 Configuration

Figure 9A:
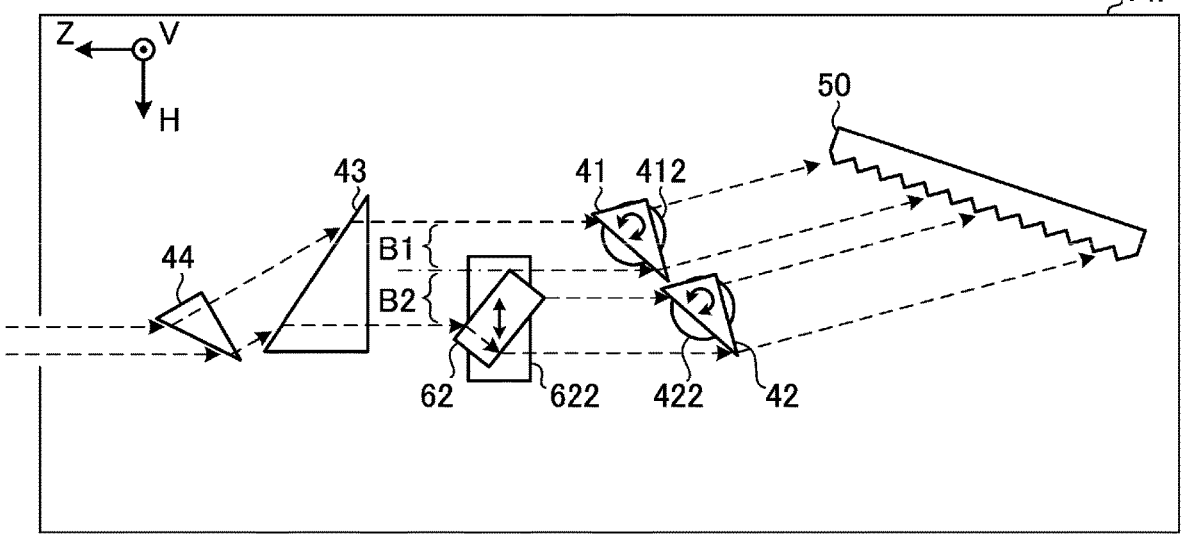
FIGS. 9A and 9B schematically illustrate the configuration of a line narrowing device in a fifth modification.
Figure 9B:
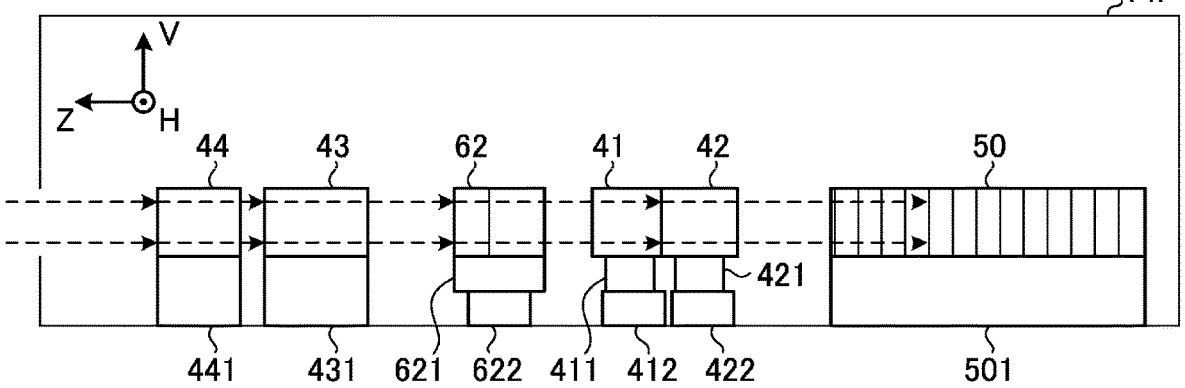

FIGS. 9A and 9B schematically illustrate the configuration of a line narrowing device 14f in a fifth modification. FIG. 9A illustrates the line narrowing device 14f viewed in the −V direction, and FIG. 9B illustrates the line narrowing device 14f viewed in the −H direction. The line narrowing device 14f includes a linear stage 622 configured to move the parallel plane substrate 62. The linear stage 622 corresponds to the third actuator in the present disclosure. In the fifth modification, no parallel plane substrate 61 may be provided.

2.6.2 Operation

The linear stage 622 moves the parallel plane substrate 62 in a direction intersecting the VZ plane parallel to both the optical path axis of the optical beam incident on the parallel plane substrate 62 from the prism 43 and the grooves of the grating 50. When the parallel plane substrate 62 is moved, the energy ratio of the first part B1 and the second part B2 changes. For example, the energy ratio of the first part B1 decreases when the parallel plane substrate 62 is moved in the −H direction, and the energy ratio of the first part B1 increases when the parallel plane substrate 62 is moved in the +H direction. Accordingly, the energy ratio of the first wavelength component and the second wavelength component of a pulse laser beam can be adjusted.

The other configuration and operation of the fifth modification are same as the configuration and operation of the fourth modification.

2.6.3 Other Exemplary Configurations

In the fifth modification, the prisms 41 and 42 are rotatable whereas the prism 43 is maintained at a constant posture, but the present disclosure is not limited thereto. In the fifth modification, similarly to the first modification, the prisms 42 and 43 may be rotatable whereas the prism 41 is maintained at a constant posture. Alternatively, the prisms 41 and 43 may be rotatable whereas the prism 42 is maintained at a constant posture.

2.6.4 Effect

In the fifth modification, the beam separation optical system includes the parallel plane substrate 62. The linear stage 622 as the third actuator moves the parallel plane substrate 62 in the direction intersecting the plane parallel to both the optical path axis of the optical beam incident on the parallel plane substrate 62 from the prism 43 and the grooves of the grating 50. Accordingly, the energy ratio of the first wavelength component and the second wavelength component of a pulse laser beam can be adjusted without the parallel plane substrate 61.

3. Line Narrowing Device Including a Plurality of Gratings

3.1 Second Embodiment

3.1.1 Configuration

Figure 10A:
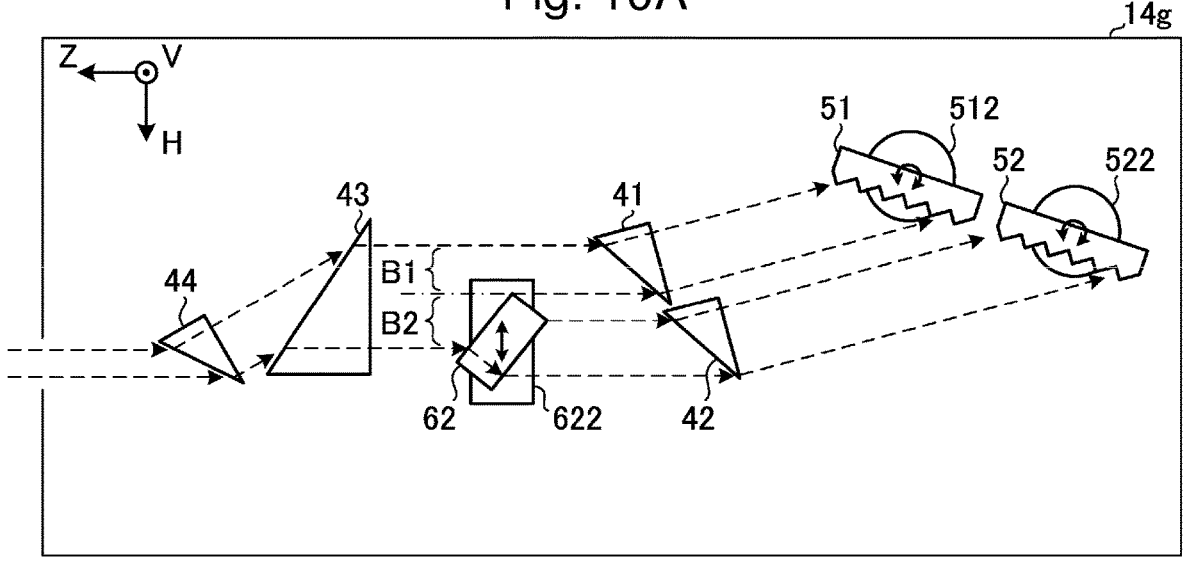
FIGS. 10A and 10B schematically illustrate the configuration of a line narrowing device in a second embodiment.
Figure 10B:
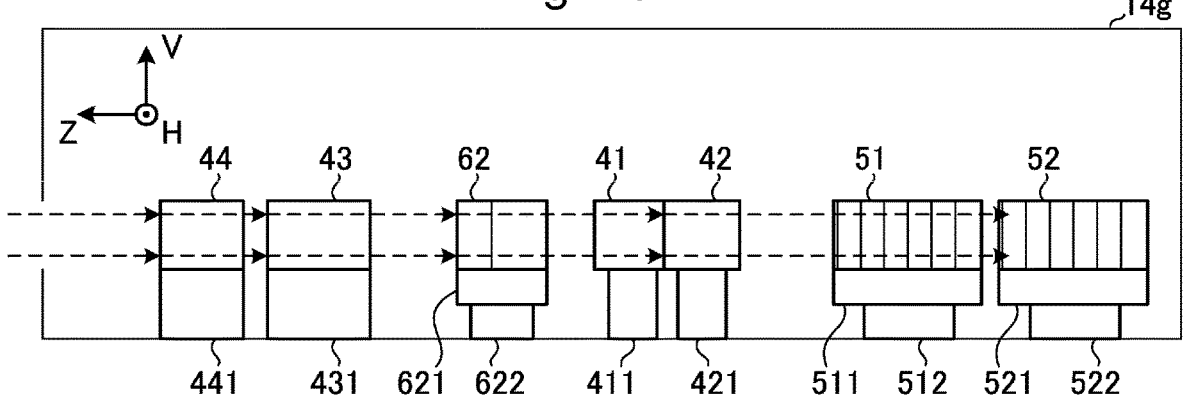

FIGS. 10A and 10B schematically illustrate the configuration of a line narrowing device 14g in a second embodiment. FIG. 10A illustrates the line narrowing device 14g viewed in the −V direction, and FIG. 10B illustrates the line narrowing device 14g viewed in the −H direction. The line narrowing device 14g includes gratings 51 and 52 in place of the grating 50.

The grating 51 is disposed on the optical path of the first part B1 of the optical beam having transmitted through the prism 41. The grating 52 is disposed on the optical path of the second part B2 of the optical beam having transmitted through the prism 42. The gratings 51 and 52 are supported by holders 511 and 521, respectively. The gratings 51 and 52 are rotatable about axes parallel to the V axis by rotation stages 512 and 522, respectively. In the second embodiment, the rotation stages 512 and 522 correspond to the first and second actuators, respectively, in the present disclosure.

In the second embodiment, the prisms 41 and 42 may be non-rotatable.

3.1.2 Operation

When the rotation stage 512 slightly rotates the grating 51, the incident angle of the first part B1 of the optical beam incident on the grating 51 from the prism 41 slightly changes. Light having a wavelength corresponding to diffraction at a diffracting angle that matches the incident angle is returned from the grating 51 to the prism 41, and thus the first wavelength, which is the wavelength of the light returned to the prism 41, changes with rotation of the grating 51.

When the rotation stage 522 slightly rotates the grating 52, the incident angle of the second part B2 of the optical beam incident on the grating 52 from the prism 42 slightly changes. Light having a wavelength corresponding to diffraction at a diffracting angle that matches the incident angle is returned from the grating 52 to the prism 42, and thus the second wavelength, which is the wavelength of the light returned to the prism 42, changes with rotation of the grating 52.

The first wavelength and the second wavelength can be separately set by controlling the rotation stages 512 and 522.

The other configuration and operation of the second embodiment are same as the configuration and operation of the fifth modification.

3.1.3 Other Exemplary Configurations

In the second embodiment, the gratings 51 and 52 are rotatable whereas the prisms 41 to 43 are maintained at constant postures, but the present disclosure is not limited thereto. In the second embodiment, among the prisms 41 to 43 and the gratings 51 and 52, any one of the prism 41 and the grating 51 and any one of the prisms 42 and 43 and the grating 52 may be rotatable whereas the others are maintained at constant postures. Alternatively, among the prisms 41 to 43 and the gratings 51 and 52, any one of the prisms 41 and 43 and the grating 51 and any one of the prism 42 and the grating 52 may be rotatable whereas the others are maintained at constant postures.

In the second embodiment, the energy ratio of the first part B1 and the second part B2 is adjusted by adjusting the position of the parallel plane substrate 62, but the present disclosure is not limited thereto. The parallel plane substrate 62 may be not moved, and similarly to the fourth modification, the parallel plane substrate 61 may be provided, and the energy ratio of the first part B1 and the second part B2 may be adjusted by adjusting the posture of the parallel plane substrate 61. Alternatively, no parallel plane substrate 62 may be provided, and similarly to the third modification, the energy ratio of the first part B1 and the second part B2 may be adjusted by moving the light-shielding plate 71 disposed to overlap part of the section of the optical path of the optical beam.

3.1.4 Effect

According to the second embodiment, the line narrowing device 14g includes the grating 51 disposed on the optical path of the first part B1 of the optical beam having passed through the prism 41, and the grating 52 disposed on the optical path of the second part B2 of the optical beam having passed through the prism 42. Accordingly, the first part B1 and the second part B2 can be received by the gratings 51 and 52 even when their optical paths are separated from each other.

The linear stage 622 as the third actuator adjusts the energy ratio of the first part B1 and the second part B2. Accordingly, the energy ratio of the first wavelength component and the second wavelength component of a pulse laser beam emitted from the line narrowed gas laser apparatus 1 can be adjusted.

According to the second embodiment, the rotation stage 512 as the first actuator rotates the grating 51 about an axis parallel to the grooves of the grating 51, in other words, about an axis parallel to the V axis. Accordingly, the first incident angle of the first part B1 of the optical beam on the grating 51 is adjusted, and the first wavelength can be controlled.

According to the second embodiment, the rotation stage 522 as the second actuator rotates the grating 52 about an axis parallel to the grooves of the grating 52, in other words, about an axis parallel to the V axis. Accordingly, the second incident angle of the second part B2 of the optical beam on the grating 52 is adjusted, and the second wavelength can be controlled.

According to the second embodiment, the line narrowing device 14g includes the parallel plane substrate 62 as the beam separation optical system disposed to overlap part of the section of the optical path of the optical beam having passed through the prism 43. The beam separation optical system separates the second part B2 from the first part B1 by transmitting part of the optical beam. This can suppress waste of part of the optical beam incident between the prism 41 and the prism 42. Moreover, the prisms 41 and 42 can be disposed at an interval from each other, and thus the prisms 41 and 42 can be each disposed outside the rotation radius of the other prism when the prisms 41 and 42 are rotatable.

According to the second embodiment, the beam separation optical system includes the parallel plane substrate 62.

The linear stage 622 as the third actuator moves the parallel plane substrate 62 in a direction intersecting a plane parallel to both the optical path axis of the optical beam incident on the parallel plane substrate 62 from the prism 43 and the grooves of the grating 52. Accordingly, the energy ratio of the first wavelength component and the second wavelength component of a pulse laser beam can be adjusted without the parallel plane substrate 61.

3.2 Sixth Modification

3.2.1 Configuration

Figure 11A:
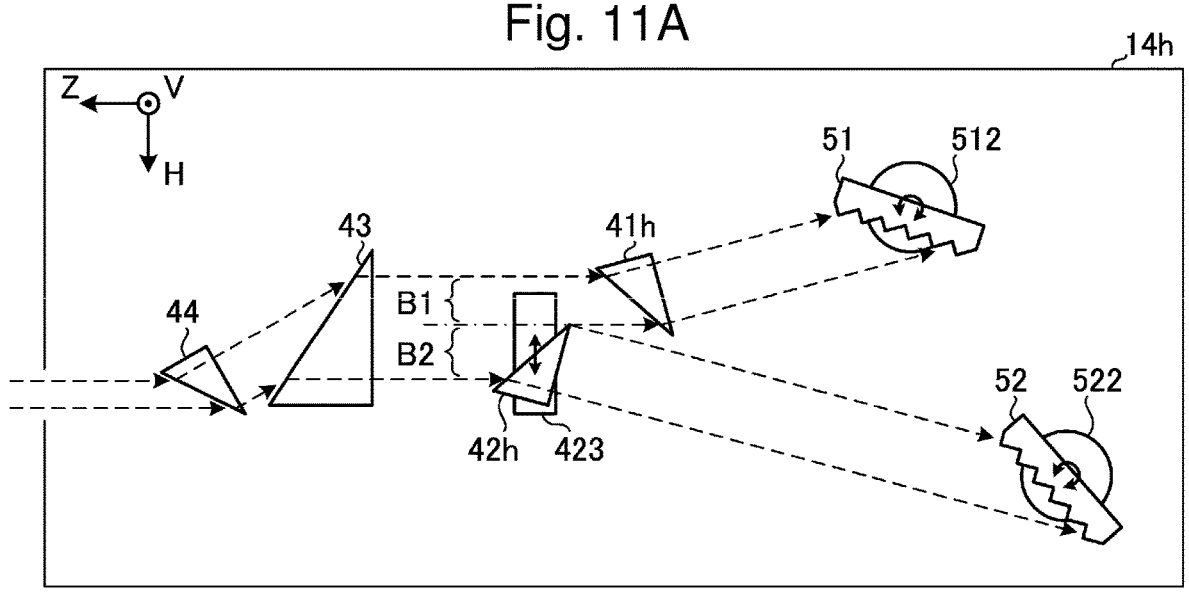
FIGS. 11A and 11B schematically illustrate the configuration of a line narrowing device in a sixth modification.
Figure 11B:
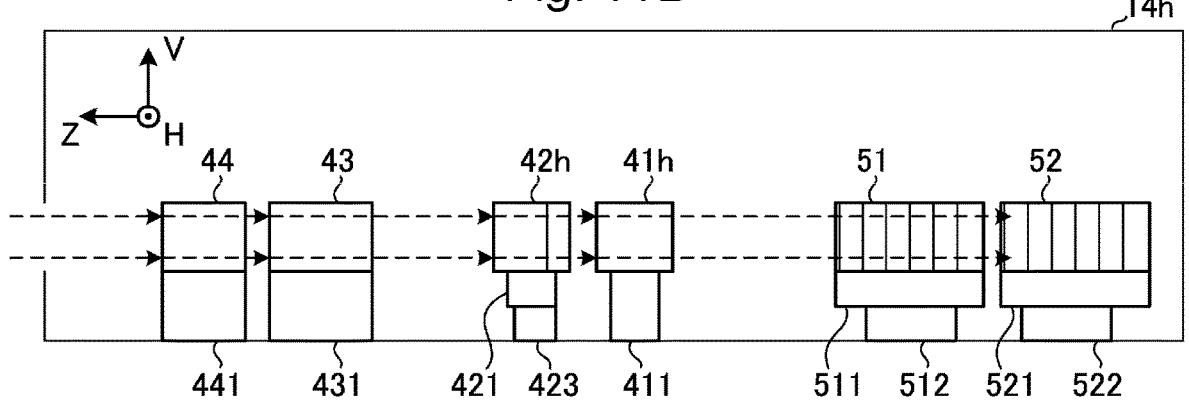

FIGS. 11A and 11B schematically illustrate the configuration of a line narrowing device 14h in a sixth modification. FIG. 11A illustrates the line narrowing device 14h viewed in the −V direction, and FIG. 11B illustrates the line narrowing device 14h viewed in the −H direction.

Two prisms 41h and 42h included in the line narrowing device 14h are disposed to refract, in directions opposite to each other, the first part B1 and the second part B2 of the optical beam output from the prism 43. Specifically, the prism 41h is disposed to bend the traveling direction of the first part B1 anticlockwise in FIG. 11A such that the first part B1 of the optical beam output toward the grating 51 travels farther from the second part B2. The prism 42h is disposed to bend the traveling direction of the second part B2 clockwise in FIG. 11A such that the second part B2 output toward the grating 52 travels farther from the first part B1.

The prism 42h is positioned upstream of the prism 41h with respect to the optical beam output from the prism 43. The prism 42h can be moved by a linear stage 423. In the sixth modification, the linear stage 423 corresponds to the third actuator in the present disclosure. In the sixth modification, no parallel plane substrate 62 may be provided.

3.2.2 Operation

The linear stage 423 moves the prism 42h in a direction intersecting the VZ plane parallel to both the optical path axis of the optical beam output from the prism 43 toward the prism 42h and the grooves of the grating 52. The beam width of the second part B2 changes when the prism 42h positioned upstream of the prism 41h with respect to the optical beam is moved. Along with this change, the beam width of the first part B1 incident on the prism 41h positioned downstream of the prism 42h with respect to the optical beam changes. Accordingly, the energy ratio of the first part B1 and the second part B2 changes. For example, the energy ratio of the first part B1 decreases when the prism 42h is moved in the −H direction, and the energy ratio of the first part B1 increases when the prism 42h is moved in the +H direction. Accordingly, the energy ratio of the first wavelength component and the second wavelength component of a pulse laser beam can be adjusted.

The other configuration and operation of the sixth modification are same as the configuration and operation of the second embodiment.

3.2.3 Other Exemplary Configurations

In the sixth modification, the gratings 51 and 52 are rotatable whereas the prisms 41h, 42h, and 43 are maintained at constant postures, but the present disclosure is not limited thereto. In the sixth modification, among the prisms 41h, 42h, and 43 and the gratings 51 and 52, any one of the prism 41h and the grating 51 and any one of the prisms 42h and 43 and the grating 52 may be rotatable whereas the others are maintained at constant postures. Alternatively, among the prisms 41h, 42h, and 43 and the gratings 51 and 52, any one of the prisms 41h and 43 and the grating 51 and any one of the prism 42h and the grating 52 may be rotatable whereas the others are maintained at constant postures.

In the sixth modification, the energy ratio of the first part B1 and the second part B2 is adjusted by adjusting the position of the prism 42h, but the present disclosure is not limited thereto. The prism 42h may be not moved, and similarly to the first embodiment, the parallel plane substrate 61 may be provided and the energy ratio of the first part B1 and the second part B2 may be adjusted by adjusting the posture of the parallel plane substrate 61.

3.2.4 Effect

According to the sixth modification, the line narrowing device 14h includes the prism 41h configured to bend the traveling direction of the first part B1 such that the first part B1 of the optical beam travels farther from the second part B2, and the prism 42h configured to bend the traveling direction of the second part B2 such that the second part B2 travels farther from the first part B1. Accordingly, since the optical path of the first part B1 and the optical path of the second part B2 are bent in directions opposite to each other, the gratings 51 and 52 can be disposed at an interval from each other, and thus the gratings 51 and 52 can be each disposed outside the rotation radius of the other grating when the gratings 51 and 52 are rotated.

According to the sixth modification, the linear stage 423 as the third actuator moves the prism 42h in the direction intersecting the VZ plane parallel to both the optical path axis of the optical beam output from the prism 43 and the grooves of the grating 52. Accordingly, the parallel plane substrates 61 and 62 are unnecessary as components for adjusting the energy ratio of the first wavelength component and the second wavelength component of a pulse laser beam.

3.3 Seventh Modification

3.3.1 Configuration

Figure 12A:
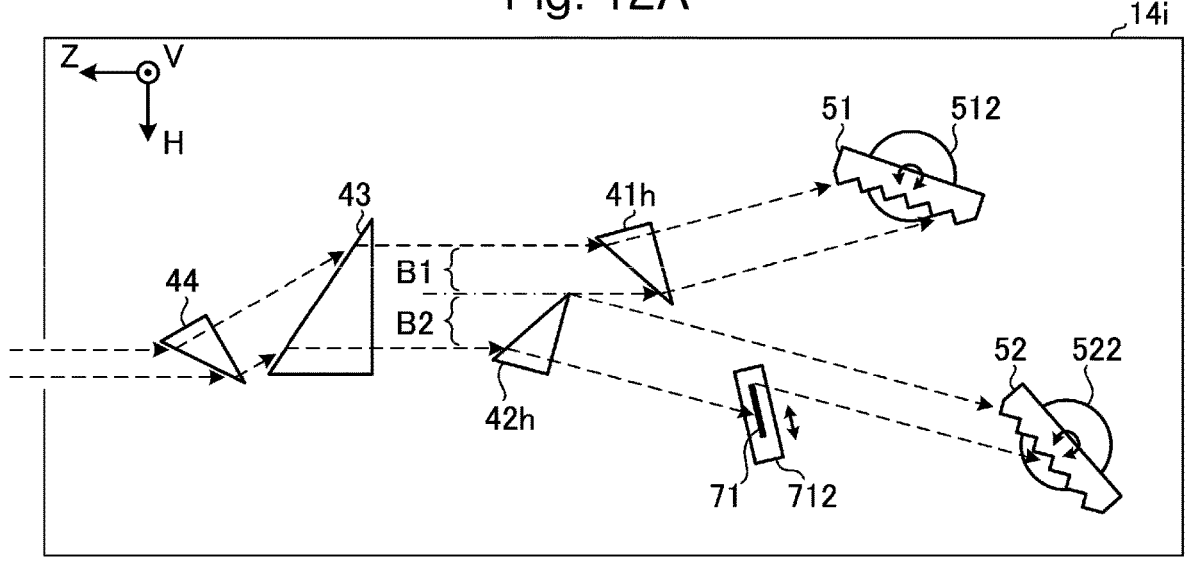
FIGS. 12A and 12B schematically illustrate the configuration of a line narrowing device in a seventh modification.
Figure 12B:
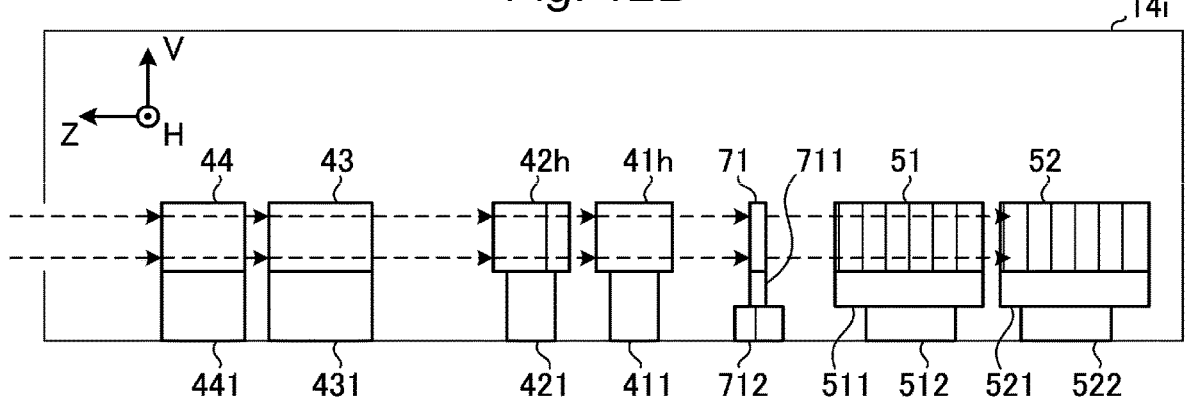

FIGS. 12A and 12B schematically illustrate the configuration of a line narrowing device 14i in a seventh modification. FIG. 12A illustrates the line narrowing device 14i viewed in the −V direction, and FIG. 12B illustrates the line narrowing device 14i viewed in the −H direction.

The line narrowing device 14i includes the light-shielding plate 71.

The light-shielding plate 71 is disposed to overlap part of the section of the optical path of the second part B2 of the optical beam having passed through the prism 42h. The light-shielding plate 71 is supported by the holder 711. The light-shielding plate 71 can be moved by the linear stage 712 in the direction intersecting the optical path axis of the second part B2.

In the seventh modification, the linear stage 712 corresponds to the third actuator in the present disclosure. In the seventh modification, no linear stage 423 that moves the prism 42h may be provided.

3.3.2 Operation

The light-shielding plate 71 absorbs part of the second part B2 of the optical beam or reflects the part out of the optical path of the optical beam. Accordingly, energy of the second part B2 incident on the grating 52 decreases as compared to a configuration in which no light-shielding plate 71 is provided.

As the linear stage 712 moves the position of the light-shielding plate 71, energy of the second part B2 incident on the grating 52 changes through the movement. Accordingly, the energy ratio of the first part B1 and the second part B2 can be adjusted. When the entire section of the optical path of the second part B2 is shielded by the light-shielding plate 71, the energy ratio of the second part B2 is zero and laser oscillation can be performed in a one-wavelength mode. When the light-shielding plate 71 is entirely retracted from the second part B2, the energy ratio of the second part B2 is maximized.

The other configuration and operation of the seventh modification are same as the configuration and operation of the sixth modification.

3.3.3 Other Exemplary Configurations

In the seventh modification, the light-shielding plate 71 is disposed on the optical path of the second part B2 of the optical beam between the prism 42h and the grating 52, but the present disclosure is not limited thereto. The light-shielding plate 71 may be disposed on the optical path of the second part B2 of the optical beam between the prism 43 and the prism 42h. Alternatively, the light-shielding plate 71 may be disposed on the optical path of the first part B1 of the optical beam between the prism 43 and the grating 51.

In the seventh modification, the gratings 51 and 52 are rotatable whereas the prisms 41h, 42h, and 43 are maintained at constant postures, but the present disclosure is not limited thereto. In the seventh modification, among the prisms 41h, 42h, and 43 and the gratings 51 and 52, any one of the prism 41h and the grating 51 and any one of the prisms 42h and 43 and the grating 52 may be rotatable whereas the others are maintained at constant postures. Alternatively, among the prisms 41h, 42h, and 43 and the gratings 51 and 52, any one of the prisms 41h and 43 and the grating 51 and any one of the prism 42h and the grating 52 may be rotatable whereas the others are maintained at constant postures.

3.3.4 Effect

According to the seventh modification, the line narrowing device 14i includes the light-shielding plate 71 disposed to overlap part of the section of the optical path of the second part B2 of the optical beam. The linear stage 712 as the third actuator moves the light-shielding plate 71 in the direction intersecting the optical path axis of the second part B2. Accordingly, the parallel plane substrates 61 and 62 are unnecessary as components for adjusting the energy ratio of the first wavelength component and the second wavelength component of a pulse laser beam.

4. Other

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. A line narrowing device comprising:
   first and second prisms disposed at positions different in a wavelength dispersion direction of any of the first and second prisms;
   a third prism that is disposed on an optical path of an optical beam and through which a beam width of the optical beam is enlarged, a first part of the optical beam is incident on the first prism, and a second part of the optical beam is incident on the second prism;
   a grating disposed across an optical path of the first part having passed through the first prism and an optical path of the second part having passed through the second prism;
   a first actuator configured to adjust an incident angle of the first part on the grating;
   a second actuator configured to adjust an incident angle of the second part on the grating; and
   a third actuator configured to adjust an energy ratio of the first part and the second part.

2. The line narrowing device according to claim 1, wherein the first actuator rotates the first prism.

3. The line narrowing device according to claim 1, wherein the second actuator rotates the second prism.

4. The line narrowing device according to claim 1, further comprising a beam shift optical system that is disposed on the optical path of the optical beam and through which the optical beam is transmitted and incident on the third prism, the beam shift optical system being configured to change a position of the optical beam incident on the third prism from the beam shift optical system in a direction intersecting a plane parallel to both an optical path axis of the optical beam and grooves of the grating by changing a position or posture of at least one optical element included in the beam shift optical system by the third actuator.

5. The line narrowing device according to claim 4, wherein
   the beam shift optical system includes a parallel plane substrate, and
   the third actuator rotates the parallel plane substrate.

6. The line narrowing device according to claim 1, wherein the first actuator rotates the third prism.

7. The line narrowing device according to claim 1, wherein the third actuator moves the first and second prisms in a direction intersecting a plane parallel to both an optical path axis of the optical beam incident on the first and second prisms from the third prism and grooves of the grating.

8. The line narrowing device according to claim 1, further comprising
   a light-shielding plate disposed to overlap part of a section of the optical path of the second part, wherein
   the third actuator moves the light-shielding plate in a direction intersecting an optical path axis of the second part.

9. The line narrowing device according to claim 1, further comprising a beam separation optical system disposed to overlap part of a section of the optical path of the optical beam having passed through the third prism, the beam separation optical system being configured to separate the second part from the first part by transmitting part of the optical beam.

10. The line narrowing device according to claim 9, wherein
    the beam separation optical system includes a parallel plane substrate, and
    the third actuator moves the parallel plane substrate in a direction intersecting a plane parallel to both an optical path axis of the optical beam incident on the parallel plane substrate from the third prism and grooves of the grating.

11. A line narrowing device comprising:
first and second prisms disposed at positions different in a wavelength dispersion direction of any of the first and second prisms;
a third prism that is disposed on an optical path of an optical beam and through which a beam width of the optical beam is enlarged, a first part of the optical beam is incident on the first prism, and a second part of the optical beam is incident on the second prism;
a first grating disposed on an optical path of the first part having passed through the first prism;
a second grating disposed on an optical path of the second part having passed through the second prism;
a first actuator configured to adjust an incident angle of the first part on the first grating;
a second actuator configured to adjust an incident angle of the second part on the second grating; and
a third actuator configured to adjust an energy ratio of the first part and the second part.

12. The line narrowing device according to claim 11, wherein the first actuator rotates the first grating about an axis parallel to grooves of the first grating.

13. The line narrowing device according to claim 11, wherein the second actuator rotates the second grating about an axis parallel to grooves of the second grating.

14. The line narrowing device according to claim 11, further comprising a beam separation optical system disposed to overlap part of a section of the optical path of the optical beam having passed through the third prism, the beam separation optical system being configured to separate the second part from the first part by transmitting part of the optical beam.

15. The line narrowing device according to claim 14, wherein
the beam separation optical system includes a parallel plane substrate, and
the third actuator moves the parallel plane substrate in a direction intersecting a plane parallel to both an optical path axis of the optical beam incident on the parallel plane substrate from the third prism and grooves of the second grating.

16. The line narrowing device according to claim 11, wherein
the first prism bends a traveling direction of the first part in a direction traveling farther from the second part relative to a traveling direction of the optical beam output from the third prism toward the first prism, and
the second prism bends a traveling direction of the second part in a direction traveling farther from the first part relative to a traveling direction of the optical beam output from the third prism toward the second prism.

17. The line narrowing device according to claim 16, wherein the third actuator moves the second prism in a direction intersecting a plane parallel to both an optical path axis of the optical beam incident on the second prism from the third prism and grooves of the second grating.

18. The line narrowing device according to claim 11, further comprising
a light-shielding plate disposed to overlap part of a section of the optical path of the second part, wherein
the third actuator moves the light-shielding plate in a direction intersecting an optical path axis of the second part.

19. An electronic device manufacturing method comprising:
generating a pulse laser beam with a laser apparatus;
emitting the pulse laser beam to an exposure apparatus; and
exposing a photosensitive substrate to the pulse laser beam in the exposure apparatus to manufacture an electronic device,
the laser apparatus including a laser chamber and an optical resonator including a line narrowing device, and
the line narrowing device including
first and second prisms disposed at positions different in a wavelength dispersion direction of any of the first and second prisms,
a third prism that is disposed on an optical path of an optical beam and through which a beam width of the optical beam is enlarged, a first part of the optical beam is incident on the first prism, and a second part of the optical beam is incident on the second prism,
a grating disposed across an optical path of the first part having passed through the first prism and an optical path of the second part having passed through the second prism,
a first actuator configured to adjust an incident angle of the first part on the grating,
a second actuator configured to adjust an incident angle of the second part on the grating, and
a third actuator configured to adjust an energy ratio of the first part and the second part.

20. An electronic device manufacturing method comprising:
generating a pulse laser beam with a laser apparatus;
emitting the pulse laser beam to an exposure apparatus; and
exposing a photosensitive substrate to the pulse laser beam in the exposure apparatus to manufacture an electronic device,
the laser apparatus including a laser chamber and an optical resonator including a line narrowing device, and
the line narrowing device including
first and second prisms disposed at positions different in a wavelength dispersion direction of any of the first and second prisms,
a third prism that is disposed on an optical path of an optical beam and through which a beam width of the optical beam is enlarged, a first part of the optical beam is incident on the first prism, and a second part of the optical beam is incident on the second prism,
a first grating disposed on an optical path of the first part having passed through the first prism,
a second grating disposed on an optical path of the second part having passed through the second prism,
a first actuator configured to adjust an incident angle of the first part on the first grating,
a second actuator configured to adjust an incident angle of the second part on the second grating, and
a third actuator configured to adjust an energy ratio of the first part and the second part.

* * * * *